(12) United States Patent
Cheng et al.

(10) Patent No.: US 12,408,347 B2
(45) Date of Patent: Sep. 2, 2025

(54) METHOD FOR FORMING A 3-D SEMICONDUCTOR MEMORY STRUCTURE COMPRISING HORIZONTAL AND VERTICAL CONDUCTIVE LINES

(71) Applicant: Taiwan Semiconductor Manufacturing Company, Ltd., Hsinchu (TW)

(72) Inventors: Chih-Hsuan Cheng, Hsinchu (TW); Chieh-Fang Chen, Hsinchu County (TW); Sheng-Chen Wang, Hsinchu (TW); Chieh-Yi Shen, Taipei (TW); Han-Jong Chia, Hsinchu (TW); Feng-Ching Chu, Pingtung County (TW); Meng-Han Lin, Hsinchu (TW); Feng-Cheng Yang, Zhudong Township (TW); Yu-Ming Lin, Hsinchu (TW); Chung-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 726 days.

(21) Appl. No.: 17/667,873

(22) Filed: Feb. 9, 2022

(65) Prior Publication Data
US 2023/0024339 A1 Jan. 26, 2023

Related U.S. Application Data

(60) Provisional application No. 63/224,113, filed on Jul. 21, 2021.

(51) Int. Cl.
*H10B 51/20* (2023.01)
*H01L 23/48* (2006.01)
(Continued)

(52) U.S. Cl.
CPC ........... *H10B 51/20* (2023.02); *H01L 23/481* (2013.01); *H01L 23/5283* (2013.01); *H10B 51/10* (2023.02)

(58) Field of Classification Search
CPC ......... H10B 51/00; H10B 51/20; H01L 23/48; H01L 23/481; H01L 23/528; H01L 23/5283
See application file for complete search history.

(56) References Cited

U.S. PATENT DOCUMENTS 9,401,371 B1 7/2016 Lee et al.
10,043,819 B1 8/2018 Lai et al.
(Continued)

FOREIGN PATENT DOCUMENTS

CN 112687697 A 4/2021
CN 113675215 A 11/2021
(Continued)

*Primary Examiner* — Britt D Hanley
*Assistant Examiner* — Connor Lewis French
(74) *Attorney, Agent, or Firm* — Eschweiler & Potashnik, LLC

(57) ABSTRACT

A method for forming a semiconductor memory structure is provided. The method includes forming a stack over a substrate, and the stack includes first dielectric layers and second dielectric layers vertically alternately arranged. The method also includes forming first dielectric pillars through the stack, and etching the stack to form first trenches. Sidewalls of the first dielectric pillars are exposed from the first trenches. The method also includes removing the first dielectric pillars to form through holes, removing the second dielectric layers of the stack to form gaps between the first dielectric layers, and forming first conductive lines in the gaps.

20 Claims, 30 Drawing Sheets

(51) Int. Cl.
   *H01L 23/528*   (2006.01)
   *H10B 51/10*   (2023.01)

(56)    References Cited

U.S. PATENT DOCUMENTS

| | | |
|---|---|---|
| 10,811,431 B1 | 10/2020 | Makala et al. |
| 2018/0342557 A1* | 11/2018 | Mori .................... H10N 70/823 |
| 2020/0185411 A1* | 6/2020 | Herner .................. H10B 43/27 |
| 2020/0227439 A1 | 7/2020 | Sato |
| 2020/0395074 A1 | 12/2020 | Harari |
| 2021/0375938 A1* | 12/2021 | Lin ........................ H10B 51/30 |
| 2021/0407845 A1* | 12/2021 | Wang .................. H01L 23/5226 |
| 2022/0020775 A1* | 1/2022 | Yang ...................... H10B 51/20 |
| 2022/0231049 A1* | 7/2022 | Lin ........................ H10B 51/20 |

FOREIGN PATENT DOCUMENTS

| | | |
|---|---|---|
| JP | 2020161816 A | 10/2020 |
| TW | 201712912 A | 4/2017 |
| TW | 201901936 A | 1/2019 |

* cited by examiner

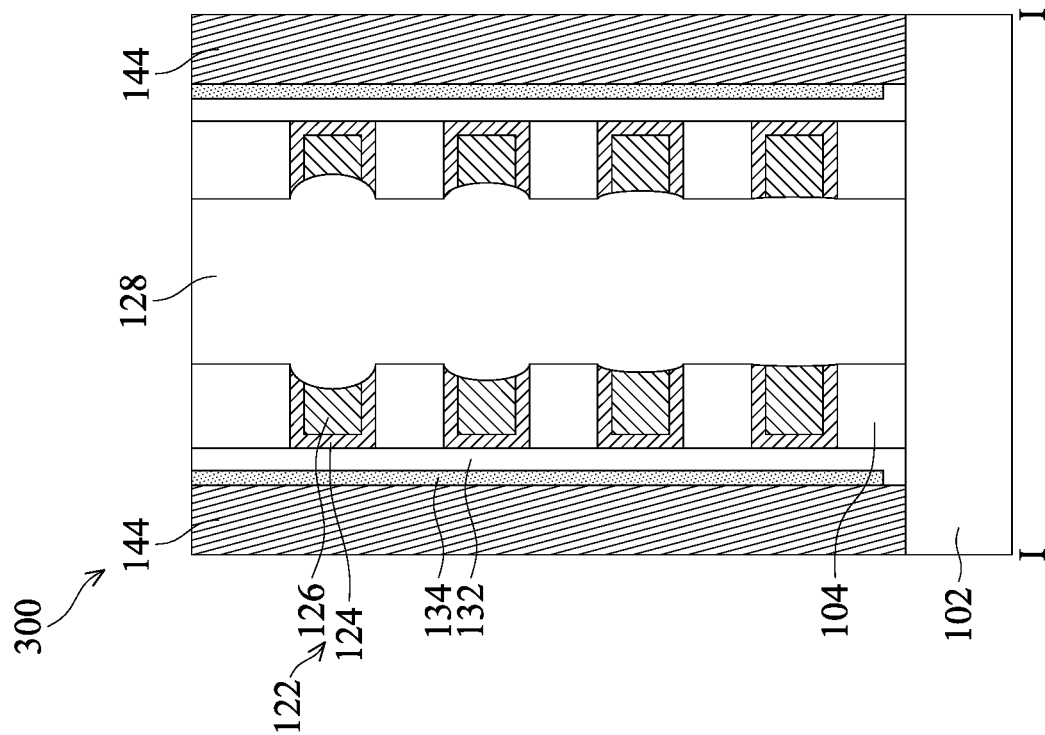
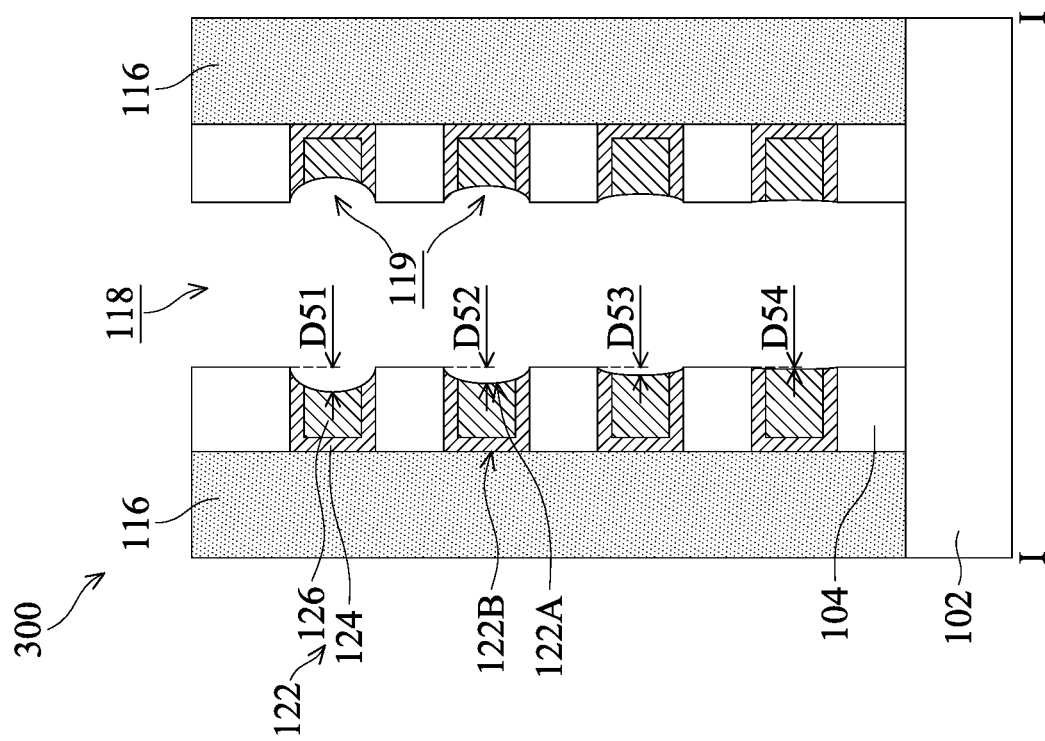
FIG. 3A
FIG. 3B

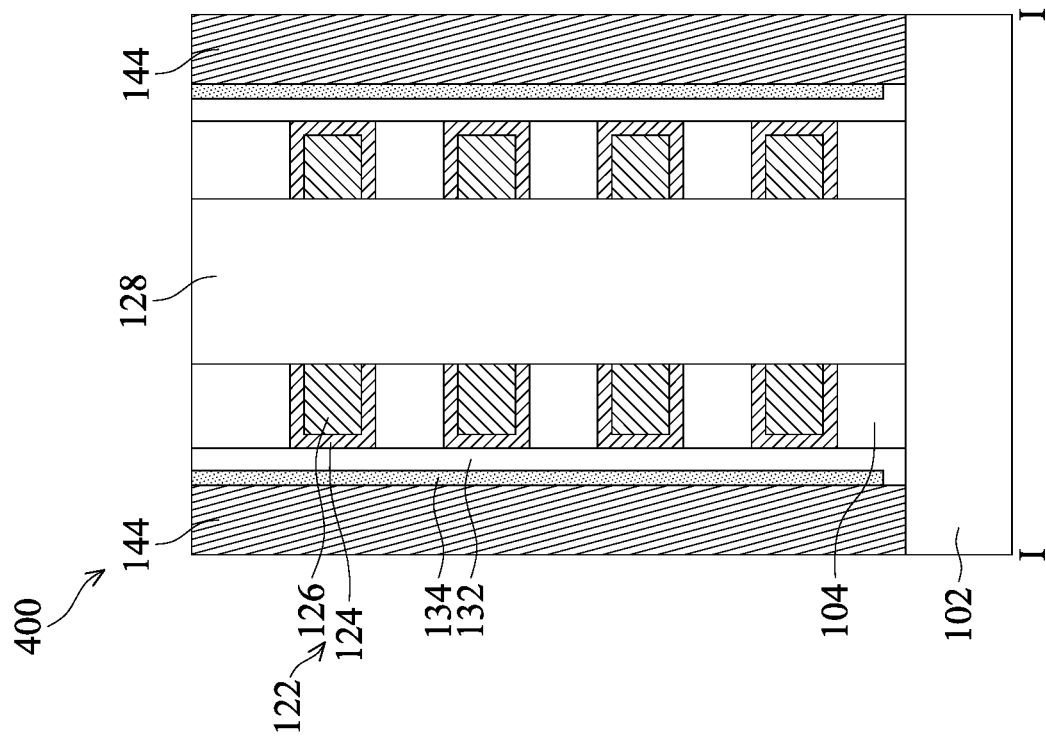
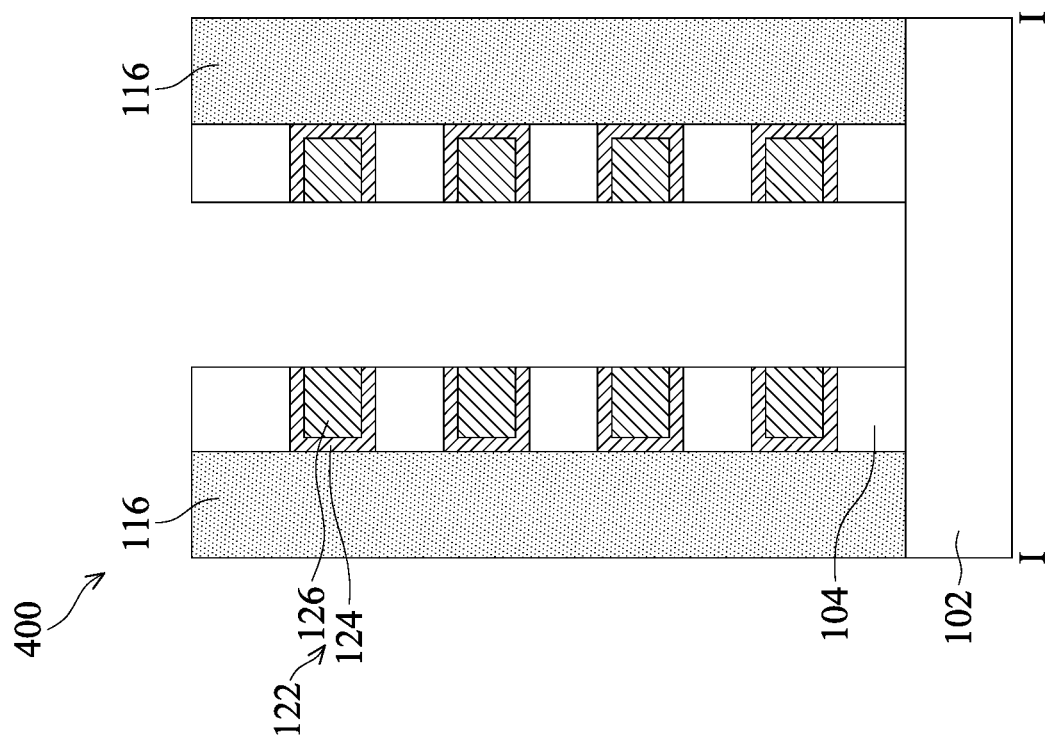
FIG. 4B
FIG. 4A

METHOD FOR FORMING A 3-D SEMICONDUCTOR MEMORY STRUCTURE COMPRISING HORIZONTAL AND VERTICAL CONDUCTIVE LINES

PRIORITY CLAIM

This application claims the benefit of U.S. Provisional Application No. 63/224,113, filed on Jul. 21, 2021 and entitled "SEMICONDUCTOR MEMORY DEVICE WITH AN STRUT STRUCTURE AND METHOD FOR FORMING THE SAME," which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

One type of device targeted for increased capacity and integration is a memory device. Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1B-1, 1C-1, 1D-1, 1E-1, 1F-1, 1G-1, 1H-1, 1I-1, 1J-1, 1K-1, 1L-1, 1M-1 and 1N-1 are plan views illustrating the formation of a semiconductor memory structure, in accordance with some embodiments of the disclosure.

FIGS. 1G-2, 1H-2, 1I-2, 1K-2, 1M-2 and 1N-2 are cross-sectional views taken along lines I-I shown in FIGS. 1G-1, 1H-1, 1I-1, 1K-1, 1M-1 and 1N-1, respectively, in accordance with some embodiments of the disclosure.

FIGS. 1H-3, 1K-3, 1M-3 and 1N-3 are cross-sectional views taken along lines II-II shown in FIGS. 1H-1, 1K-1, 1M-1 and 1N-1, respectively, in accordance with some embodiments of the disclosure.

FIG. 2 is a cross-sectional view of a semiconductor memory structure, in accordance with some embodiments of the disclosure.

FIGS. 3A and 3B are cross-sectional views illustrating the formation of a semiconductor memory structure, in accordance with some embodiments of the disclosure.

FIGS. 4A and 4B are cross-sectional views illustrating the formation of a semiconductor memory structure, in accordance with some embodiments of the disclosure.

DETAILED DESCRIPTION

Figure 1A:
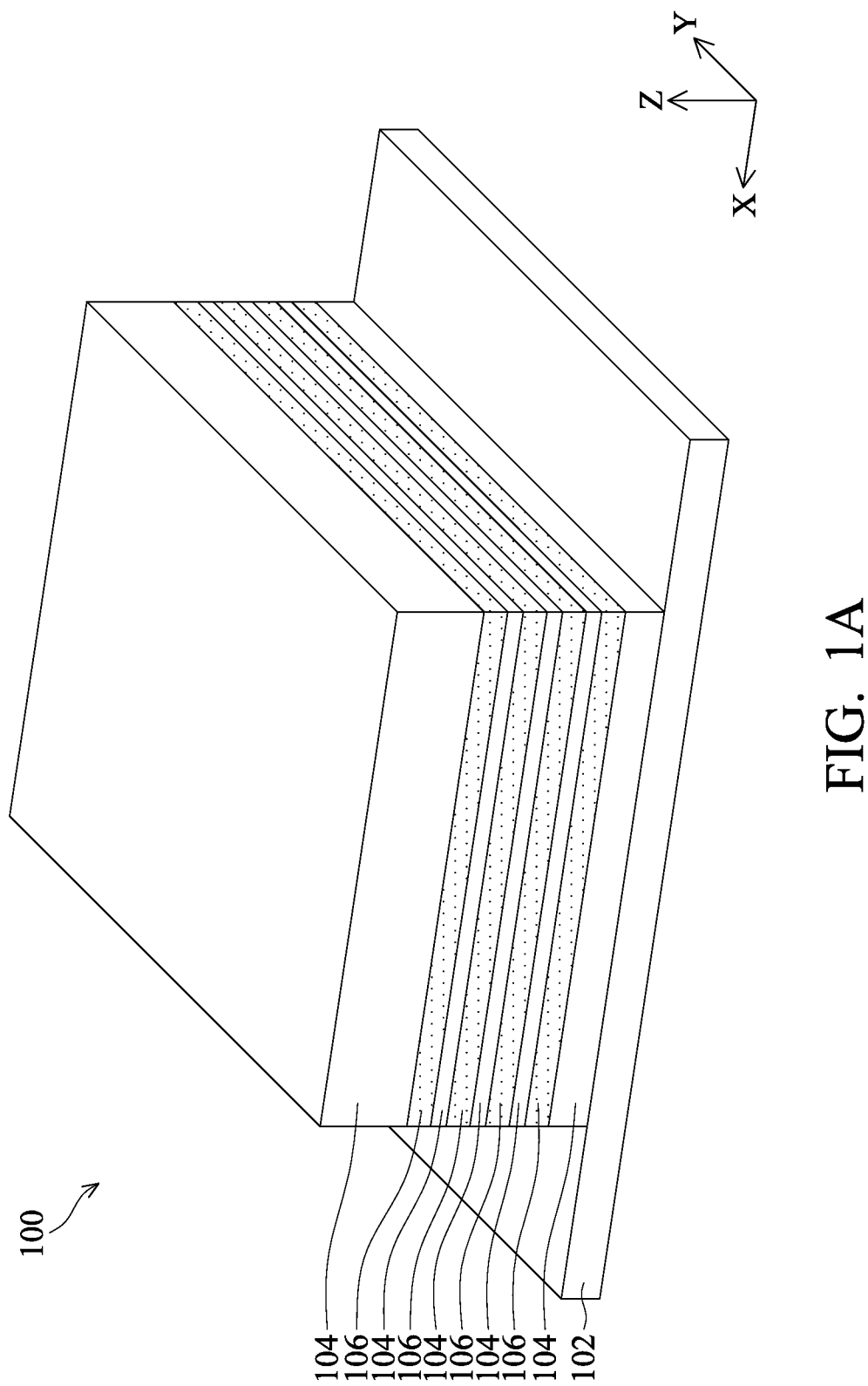
FIGS. 1A, 1B, 1C, 1D, 1E, 1F, 1G, 1H, 1I, 1J, 1K, 1L, 1M and 1N are perspective views illustrating the formation of a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by a person skilled in the art. For example, the term "about 5 nm" encompasses the dimension range from 4.5 nm to 5.5 nm.

3D NOR memory is a flash memory in which memory cells are stacked vertically to provide much higher storage density and lower cost per gigabyte in comparison to an existing memory. The density of 3D memory is increased by stacking more memory gate films for forming word lines or transistor layers. The stack of the gate films is vertically cut through into several strips and trenches between the strips. For example, the aspect ratio (height/width) of the trenches can be greater than about 20. However, as the strips including the gate films become narrower and taller, the risk that the strips collapse and/or wiggle is higher, thereby decreasing the manufacturing yield of the memory device.

In addition, dielectric layers of the strips are replaced with the gate films by etching-deposition-etching back processes. The gate films usually suffer lateral recess and have concave etched surfaces, which may lead to higher resistance. Furthermore, channel layers formed along the strips may also have uneven profiles (also referred to as bird's beak issue), thereby degrading the performance of the memory device.

Embodiments for forming a semiconductor memory structure are provided. The method for forming the semiconductor memory structure may include forming a stack which includes first dielectric layers and second dielectric layers alternately arranged, forming first dielectric pillars through the stack, and etching the stack to form a plurality of first trenches and strips between the trenches, in accordance with some embodiments. The first dielectric pillars may support the strips, thereby decreasing the risk of collapsing and/or wiggling of the strips, in accordance with some embodiments. Therefore, the manufacturing yield of the resulting semiconductor memory device may improve.

In addition, the method also includes forming sacrificial layers in the trenches, replacing the second dielectric layers with conductive lines, and forming channel layers along strips including the conductive lines and the first dielectric layers. As a result, the conductive lines may be formed with substantially flat sidewalls, and the channel layers formed thereon also have substantially flat profiles. Therefore, the performance of the resulting semiconductor memory device may improve.

FIGS. 1A, 1B, 1C, 1D, 1E, 1F, 1G, 1H, 1I, 1J, 1K, 1L, 1M and 1N are perspective views illustrating the formation of a semiconductor memory structure 100, in accordance with some embodiments. FIGS. 1B-1, 1C-1, 1D-1, 1E-1, 1F-1, 1G-1, 1H-1, 1I-1, 1J-1, 1K-1, 1L-1, 1M-1 and 1N-1 are plan views of the semiconductor memory structure 100 that are horizontally cut through a second dielectric layer 106 or first conductive lines 122, in accordance with some embodiments.

FIG. 1A illustrate a semiconductor memory structure 100, in accordance with some embodiments. The semiconductor memory structure 100 includes a substrate 102, in accordance with some embodiments. In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

In some embodiments, the substrate 102 includes semiconductor devices formed on the semiconductor substrate. For example, the semiconductor device may be peripheral circuits which may include various devices such as metal-oxide-semiconductor (MOS) FETs, fin FETs, nanostructure FETs (e.g., gate-all-around (GAA) FETs), or another suitable type of semiconductor device.

In some embodiment, the substrate 102 may also include an interconnect structure that includes multiple dielectric layers and electrically conductive features (such as contacts, metal lines and/or conductive vias) in the dielectric layers. The peripheral circuits may be operable to access and/or control devices of a memory cell array (e.g., to perform read/write/erase operations) formed thereabove through the conductive features of the interconnect structure.

For a better understanding of the semiconductor memory structure 100, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

A stack including first dielectric layers 104 and second dielectric layers 106 is formed over the substrate 102, as shown in FIG. 1A, in accordance with some embodiments. In some embodiments, the semiconductor memory structure 100 may include various device regions, e.g., a logic region, a memory cell array region, an analog region, a peripheral region, another suitable region, and/or a combination thereof. The stack is formed in the memory cell array region of the semiconductor memory structure 100, in accordance with some embodiments.

The first dielectric layers 104 and the second dielectric layers 106 are vertically alternately stacked, in accordance with some embodiments. In some embodiments, the second dielectric layers 106 are configured as sacrificial layers which will be replaced with conductive lines (such as word lines). In some embodiments, the first dielectric layers 104 are configured as insulating layers to physically and electrically isolate conductive lines from one another.

In some embodiments, the number of the first dielectric layers 104 is one more than the number of the second dielectric layers 106. That is, both the top layer and the bottom layer of the stack are first dielectric layers 104. Although five first dielectric layers 104 and four second dielectric layers 106 are shown in FIG. 1A, the numbers of the first dielectric layers 104 and the second dielectric layers 106 are not limited thereto, and can be in a range from 2 to about 100.

In some embodiments, the thickness of each of the first dielectric layers 104 is in a range from about 10 nm to about 200 nm. In some embodiments, the uppermost first dielectric layer 104 is thicker than other first dielectric layers 104. In some embodiments, the thickness of each of the second dielectric layers 106 is in a range from about 10 nm to about 200 nm.

In some embodiments, the first dielectric layers 104 and the second dielectric layers 106 are made dielectric materials such as silicon oxide ($SiO_2$), silicon oxynitride (SiON), silicon nitride (SiN), silicon oxycarbide (SiOC), silicon carbon nitride (SiCN), silicon oxycarbonitride (SiOCN), or a combination thereof. In some embodiments, the first dielectric layers 104 and the second dielectric layers 106 are made of different materials and have a difference in etching selectivity. In some embodiments, the first dielectric layers 104 are made of an oxide-based dielectric material (such as silicon oxide) and the second dielectric layers 106 are made of a nitride-based dielectric material (such as silicon nitride).

In some embodiments, the first dielectric layers 104 and the second dielectric layers 106 are deposited using atomic layer deposition (ALD), chemical vapor deposition (CVD) (such as low-pressure CVD (LPCVD), plasma-enhanced CVD (PECVD), high density plasma CVD (HDP-CVD)), another suitable technique, and/or a combination thereof. In some embodiments, the formation of the stack may be integrated into the CMOS manufacturing process, e.g., the back end of line (BEOL) process. For example, the stack may be located at the fifth level (M5) and/or sixth metal layer (M6) of metal layers of an interconnect structure.

Figure 1B:
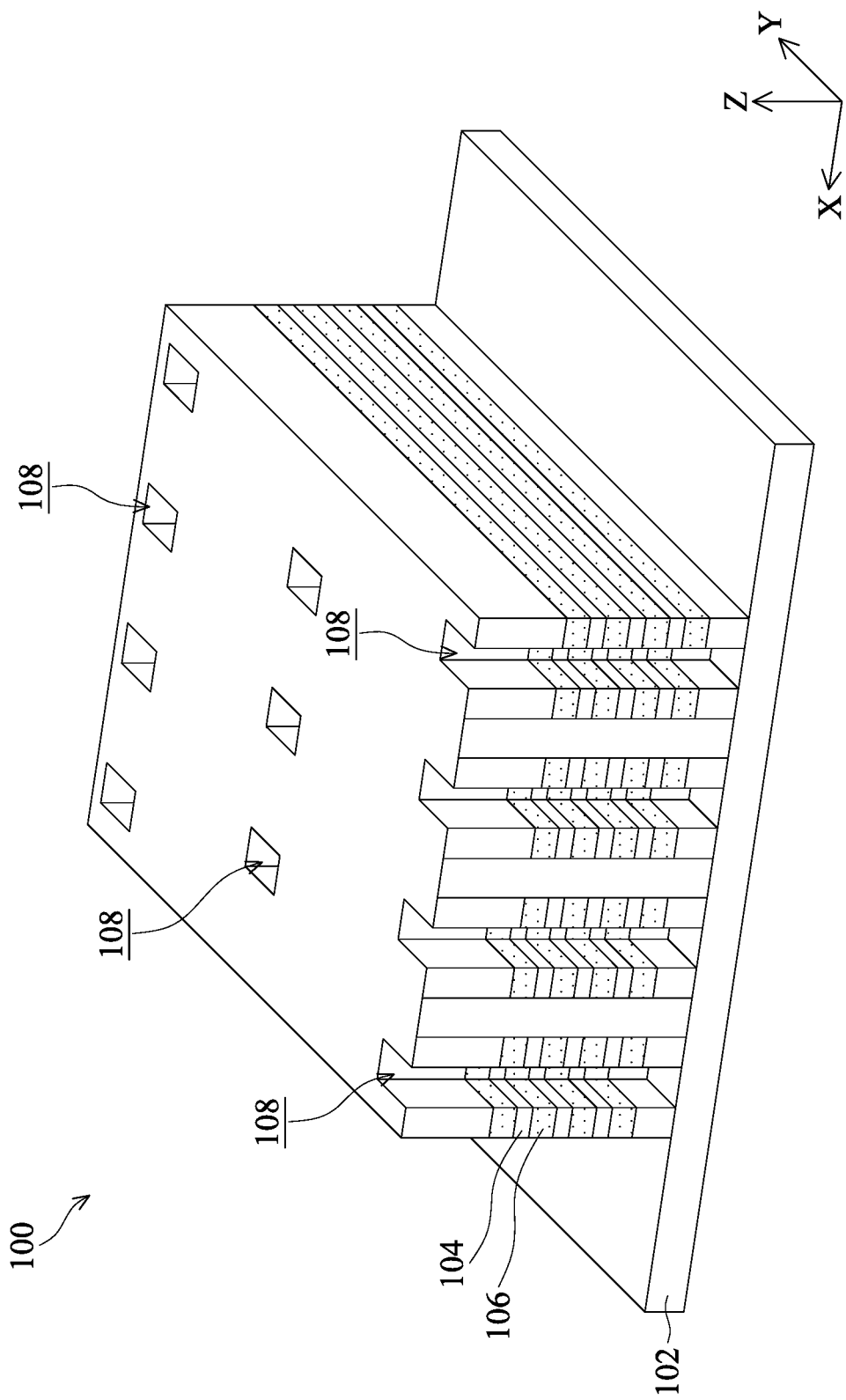
Figures 1, 1B:
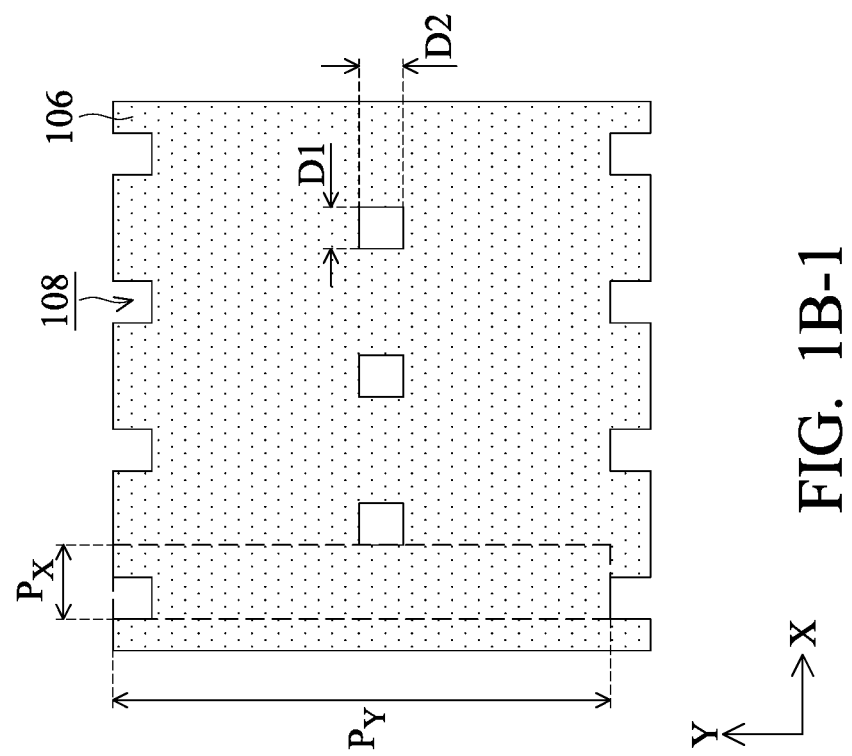

FIGS. 1B and 1B-1 illustrate the formation of first through holes 108, in accordance with some embodiments.

First through holes 108 are formed through the stack including the first dielectric layers 104 and the second dielectric layers 106, as shown in FIGS. 1B and 1B-1, in accordance with some embodiments. In some embodiments, the formation of the first through holes 108 includes forming a patterned mask layer (not shown) having opening patterns corresponding to the first through holes 108 over the stack, and then etching the stack using the patterned mask layer to transfer the opening patterns into the stack until the substrate 102 is exposed. In some embodiments, the patterned mask layer is a patterned photoresist layer which is formed by a photolithography process. The etching process may be an anisotropic etching process such as dry plasma etching, an isotropic etching process such as dry chemical etching, remote plasma etching, wet chemical etching, and/or a combination thereof.

In some alternative embodiments, the patterned mask layer is a patterned hard mask layer, which is formed by depositing a dielectric layer, forming a patterned photoresist layer over the dielectric layer, and etching the dielectric layer to transfer the opening patterns of the photoresist layer into the dielectric layer. The patterned mask layer may be removed during the etching process or by an additional process (such as etching, wet strip and/or ashing).

The first through holes 108 are arranged in a row/column configuration, in accordance with some embodiments. For example, rows of first through holes 108 extend in the X direction, and columns of first through holes 108 extend in the Y direction. In some embodiments, the first through holes 108 in neighboring two columns may be staggered with each other (e.g., not overlap in the X direction).

In some embodiments, the first through holes 108 have a dimension D1 as measured in the X direction. In some embodiments, the dimension D1 is in a range from about 50 nm to about 300 nm. In some embodiments, the first through holes 108 have a dimension D2 as measured in the Y direction. In some embodiments, the dimension D2 is in a range from about 50 nm to about 500 nm.

In some embodiments, the first through holes 108 are arranged at an X-pitch $P_X$ (in the X direction), which is in a range from about 150 nm to about 500 nm. In some embodiments, the first through holes 108 are arranged at a Y-pitch $P_Y$ (in the Y direction), which is in a range from about 500 nm to about 10 um. In some embodiments, the ratio ($P_Y$/D2) of the Y-pitch $P_Y$ to the dimension D2 is in a range from about 1 to about 50.

Figure 1C:
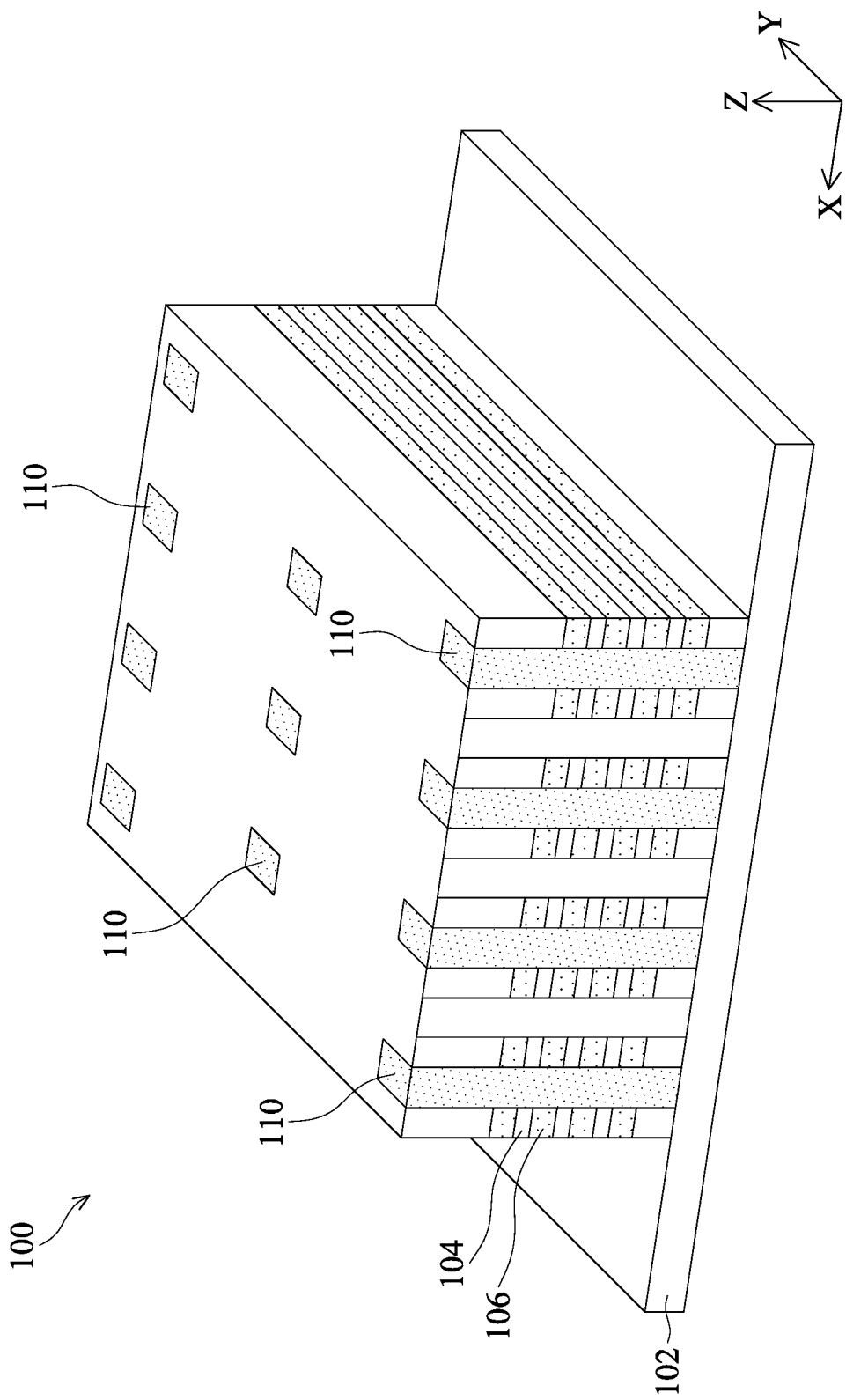
Figures 1, 1C:
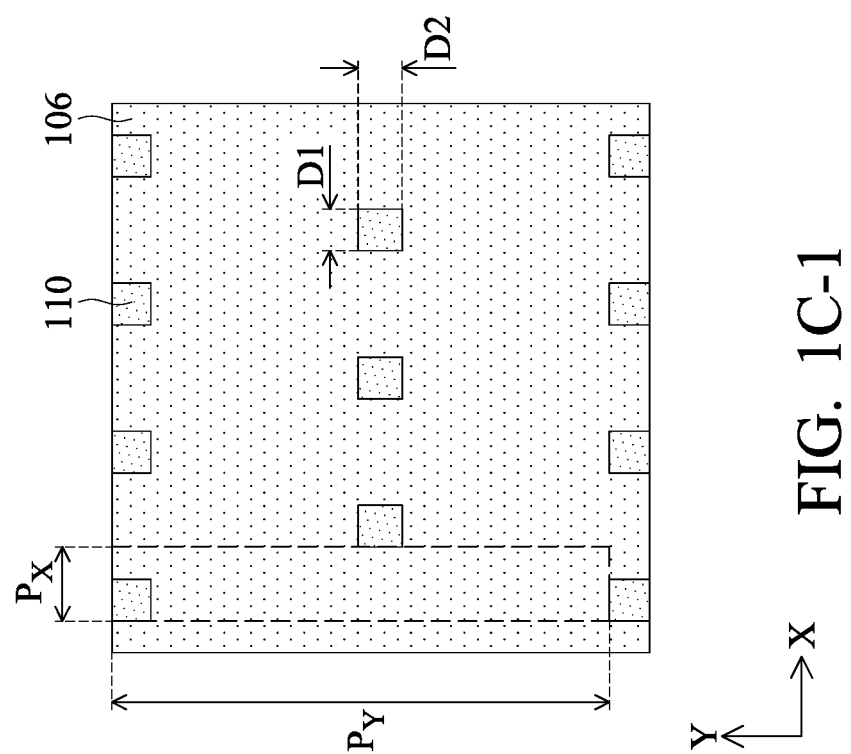

FIGS. 1C and 1C-1 illustrate the formation of first dielectric pillars 110, in accordance with some embodiments.

First dielectric pillars 110 are formed in the first through holes 108, as shown in FIGS. 1C and 1C-1, in accordance with some embodiments. The first dielectric pillars 110 penetrate through the stack and are in contact with the substrate 102, in accordance with some embodiments. The first dielectric pillars 110 are configured to support subsequently formed strips from collapsing and/or wiggling, in accordance with some embodiments.

In some embodiments, the first dielectric pillars 110 are made of a dielectric material such as silicon nitride (SiN), silicon oxynitride (SiON), silicon oxide ($SiO_2$), silicon oxycarbide (SiOC), silicon carbon nitride (SiCN), silicon oxycarbonitride (SiOCN), or a combination thereof. In some embodiments, the first dielectric pillars 110 are made of the same material as the second dielectric layers 106, e.g., a nitride-based dielectric material (such as silicon nitride).

In some embodiments, the first dielectric pillars 110 are formed by depositing a dielectric material to overfill the first through holes 108, and then planarizing the dielectric material to removing the portion of the dielectric material formed above the stack until the uppermost first dielectric layer 104 is exposed. The deposition process may be ALD, CVD (such as LPCVD, PECVD, HDP-CVD, high aspect ratio process (HARP), flowable CVD (FCVD)), another suitable technique, and/or a combination thereof. The planarizing process may be an etching back process and/or chemical mechanical polishing (CMP).

The first dielectric pillars 110 are arranged in a row/column configuration, in accordance with some embodiments. For example, rows of first dielectric pillars 110 extend in the X direction, and columns of first dielectric pillars 110 extend in the Y direction. In some embodiments, the first dielectric pillars 110 in neighboring two columns may be staggered with each other (e.g., not overlap in the X direction).

In some embodiments, the first dielectric pillars 110 also have the dimension D1 as measured in the X direction. In some embodiments, the dimension D1 is in a range from about 50 nm to about 300 nm. In some embodiments, the first dielectric pillars 110 also have the dimension D2 as measured in the Y direction. In some embodiments, the dimension D2 is in a range from about 50 nm to about 500 nm.

In some embodiments, the first dielectric pillars 110 are arranged at an X-pitch $P_X$ (in the X direction), which is in a range from about 150 nm to about 500 nm. In some embodiments, the first dielectric pillars 110 are arranged at a Y-pitch $P_Y$ (in the Y direction), which is in a range from about 500 nm to about 10 um. In some embodiments, the ratio ($P_Y$/D2) of the Y-pitch $P_Y$ to the dimension D2 is in a range from about 1 to about 50. If the ratio ($P_Y$/D2) or the Y-pitch $P_Y$ is too small, the areal density of memory cells may decrease. If the ratio ($P_Y$/D2) or the Y-pitch $P_Y$ is too large, the risk that subsequently formed strips collapse and/or wiggle may increase.

Figure 1D:
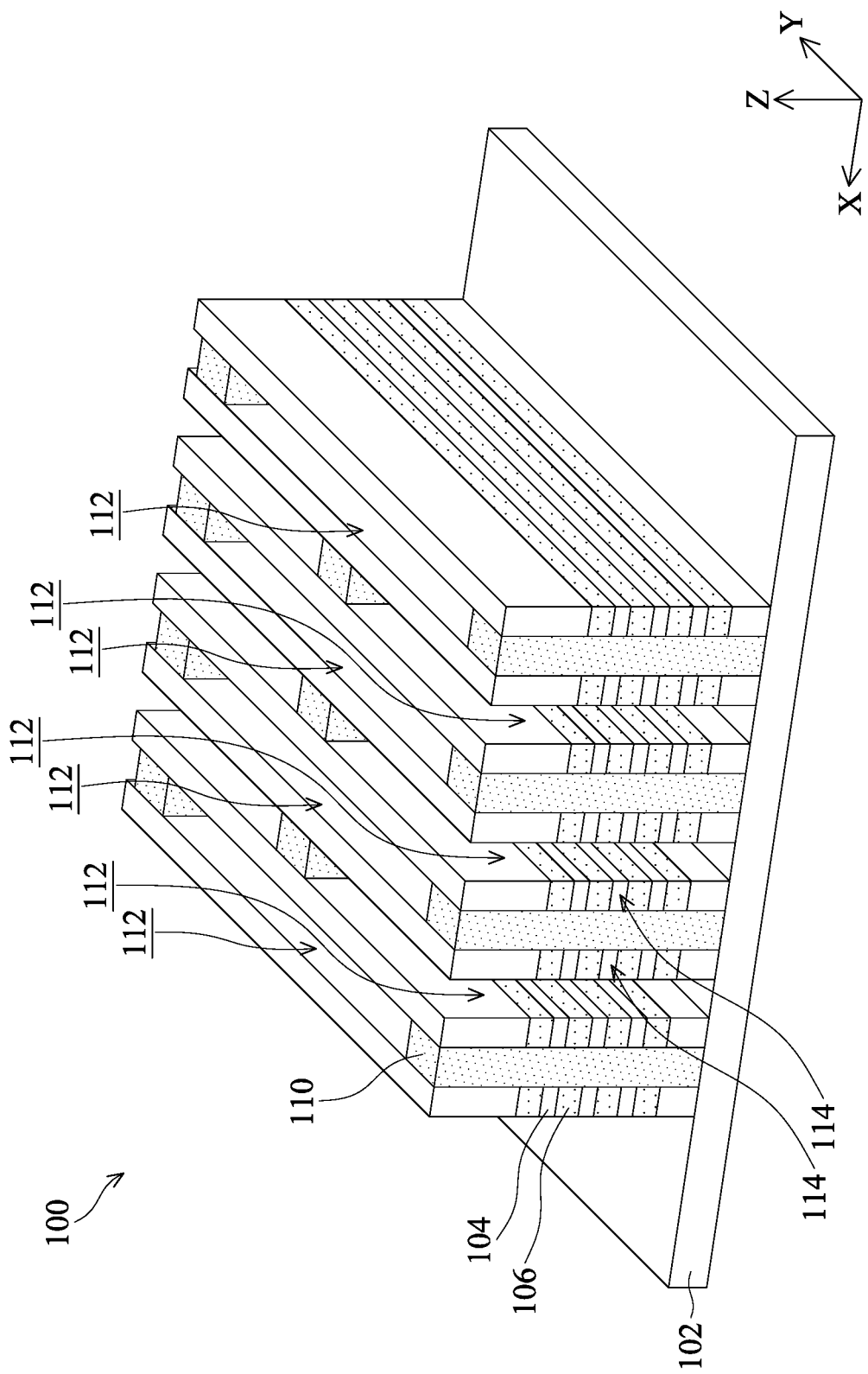
Figures 1, 1D:
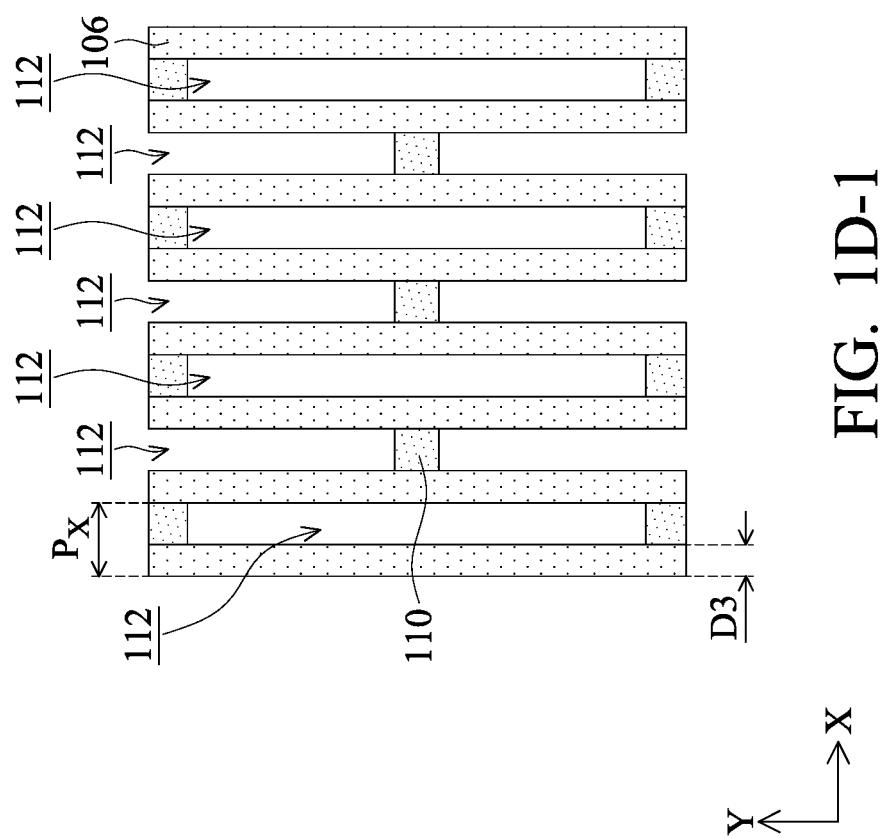

FIGS. 1D and 1D-1 illustrate the formation of first trenches 112, in accordance with some embodiments.

First trenches 112 are formed through the stack including first dielectric layers 104 and the second dielectric layers 106, as shown in FIGS. 1D and 1D-1, in accordance with some embodiments. In some embodiments, the first trenches 112 extend in the Y direction and are formed aligned with the columns of first dielectric pillars 110. In some embodiments, each of the first trenches 112 is formed between and exposes neighboring two first dielectric pillars 110 in a column.

In some embodiments, the formation of the first trenches 112 includes forming a patterned mask layer (not shown) having trench patterns corresponding to the first trenches 112 over the stack, and then etching the stack using the patterned mask layer to transfer the trench patterns into the stack until the substrate 102 is exposed. The stack is cut through into several strips 114, which protrude from between the first trenches 112, in accordance with some embodiments. In some embodiments, the patterned mask layer is a patterned photoresist layer which is formed by a photolithography process. The etching process may be an anisotropic etching process such as dry plasma etching, an isotropic etching process such as dry chemical etching, remote plasma etching, wet chemical etching, and/or a combination thereof.

Each of the first dielectric pillars 110 may support the neighboring two strips 114, thereby decreasing the risk of collapsing and/or wiggling of the strips 114, in accordance with some embodiments. As a result, the manufacturing yield of the resulting semiconductor memory device may improve.

In some alternative embodiments, the patterned mask layer is a patterned hard mask layer, which is formed by depositing a dielectric layer, forming a patterned photoresist layer over the dielectric layer, and etching the dielectric layer to transfer the trench patterns of the photoresist layer into the dielectric layer. The patterned mask layer may be removed during the etching process or by an additional process (such as etching, wet strip and/or ashing).

In some embodiments, the strips include alternatively stacked the first dielectric layers 104 and the second dielectric layers 106. In some embodiments, the strips 114 extend in the Y direction and are arranged in parallel in the X direction. That is, the strips 114 have longitudinal axes parallel to Y direction. In some embodiments, the strips 114 have a dimension D3 as measured in the X direction. In some embodiments, the dimension D3 is in a range from about 50 nm to about 250 nm. In some embodiments, the strips 114 (or the first trenches 112) also have X-pitch $P_X$ (in the X direction), which is in a range from about 150 nm to about 500 nm.

Figure 1E:
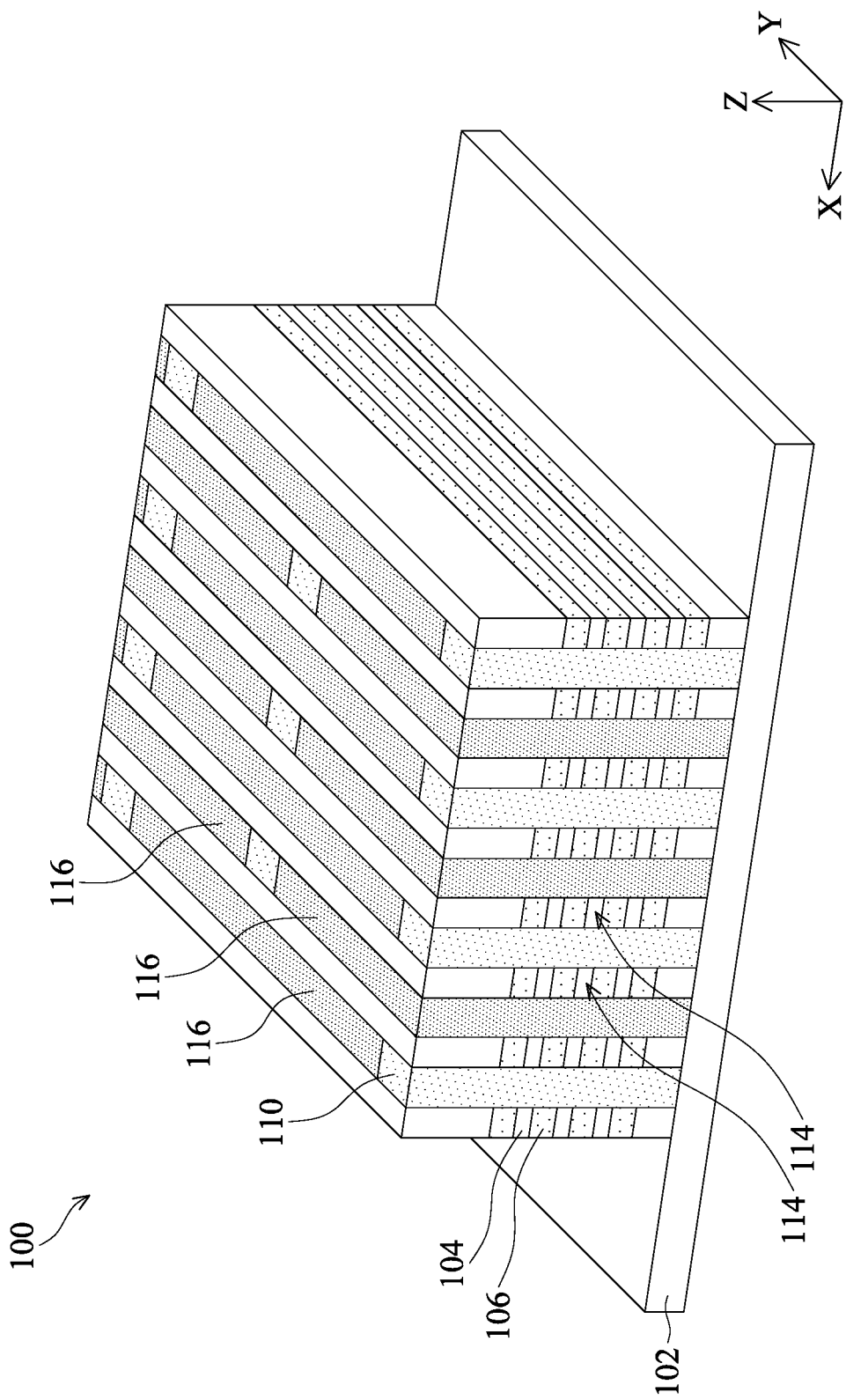
Figures 1, 1E:
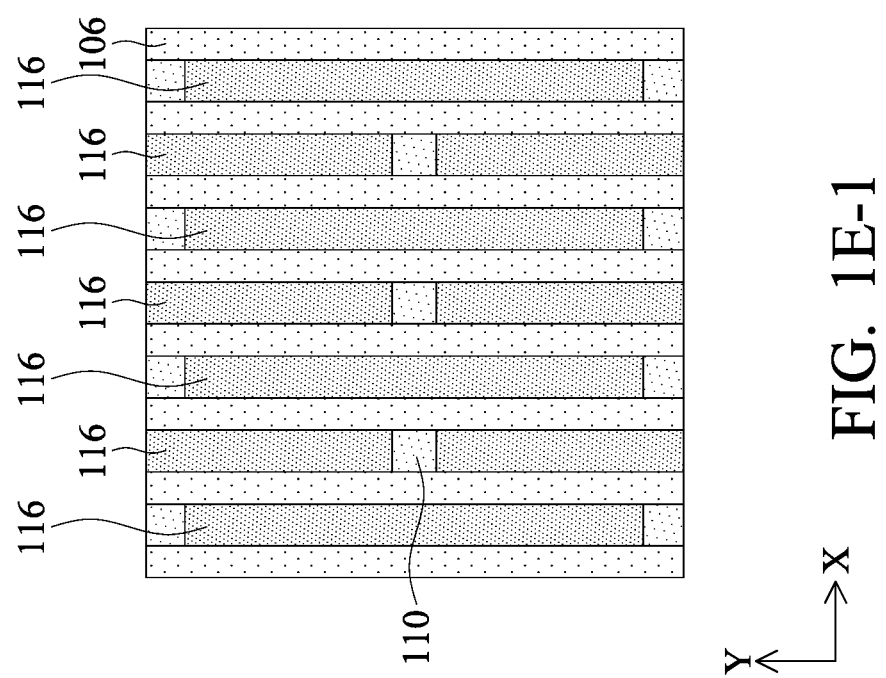

FIGS. 1E and 1E-1 illustrate the formation of sacrificial layers 116, in accordance with some embodiments.

Sacrificial layers 116 are formed in the first trenches 112, as shown in FIGS. 1E and 1E-1, in accordance with some embodiments. Each of the sacrificial layers 116 is formed between neighboring two first dielectric pillars 110 in a column and between neighboring two strips 114, in accordance with some embodiments. The sacrificial layers 116 are in contact with the first dielectric pillars 110, the strips 114, and the substrate 102, in accordance with some embodiments. The sacrificial layers 116 are configured as retaining walls to constrain subsequently formed conductive lines to have sidewalls with desired profiles, in accordance with some embodiments.

In some embodiments, the sacrificial layers 116 are made of a semiconductor material such as silicon (Si), germanium (Ge) and/or silicon germanium (SiGe), and/or a metal oxide such as zirconium dioxide ($ZrO_2$), hafnium oxide ($HfO_2$), aluminum oxide ($Al_2O_3$) yttrium oxide ($Y_2O_3$), lanthanum oxide ($La_2O_3$), or a combination thereof. In some embodiments, the sacrificial layers 116 have a different etching selectivity than the first dielectric layers 104, the second dielectric layers 106, the first dielectric pillars 110, and subsequently formed conductive lines.

In some embodiments, the sacrificial layers 116 are formed by depositing a material for the sacrificial layers 116 to overfill the first trenches 112, and then planarizing the material for the sacrificial layers 116 to remove the portion of the material for the sacrificial layers 116 formed above the strips 114 until the uppermost first dielectric layer 104 is exposed. The deposition process may be ALD, CVD (such as LPCVD, PECVD, HDP-CVD, HARP, and FCVD), another suitable technique, and/or a combination thereof. The planarizing process may be an etching back process and/or chemical mechanical polishing (CMP).

Figure 1F:
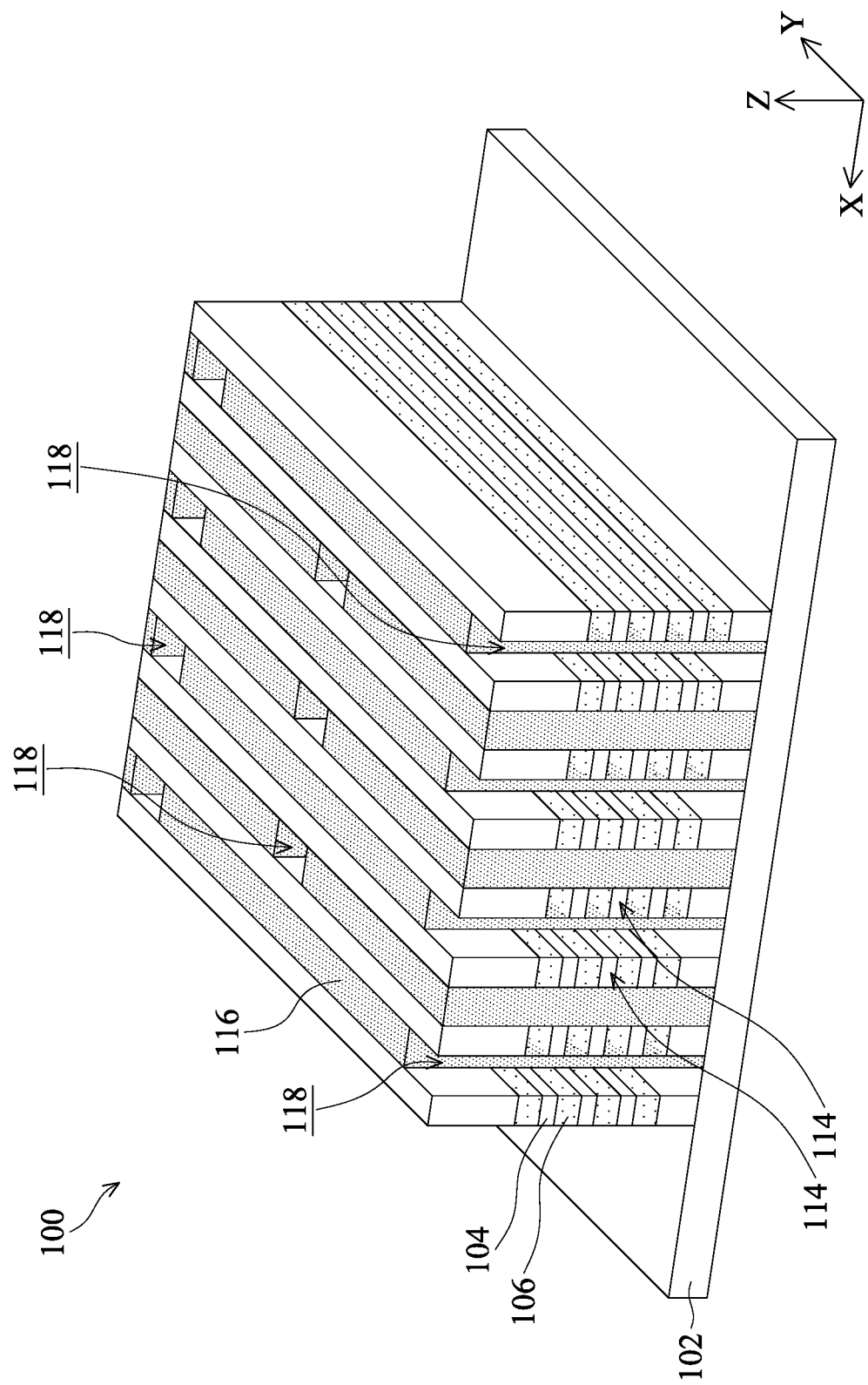
Figures 1, 1F:
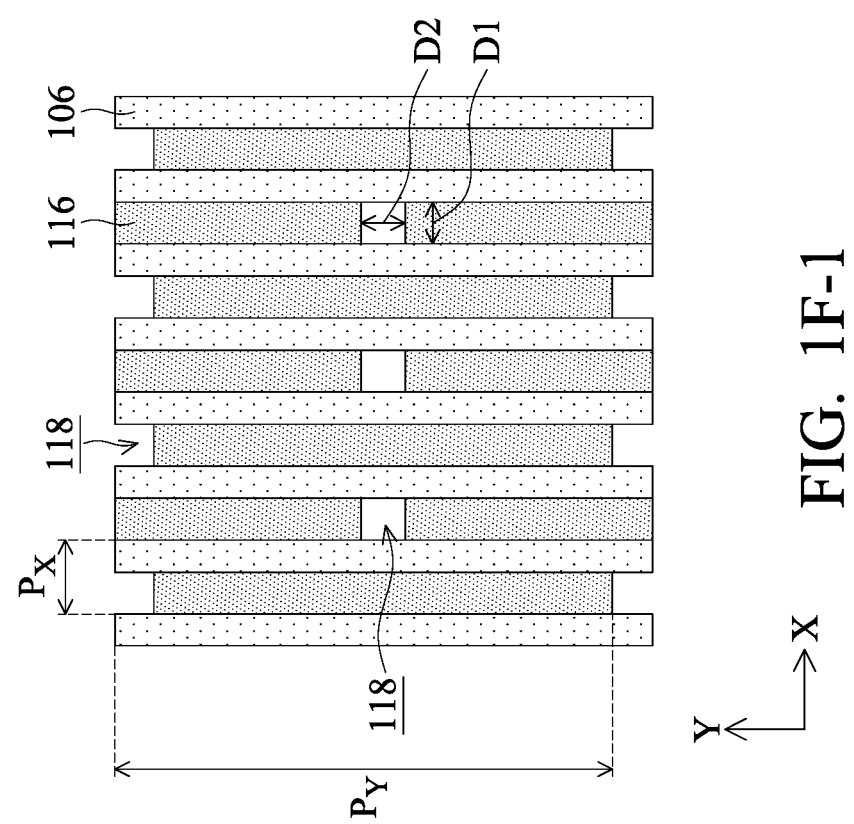

FIGS. 1F and 1F-1 illustrate the formation of second through holes 118, in accordance with some embodiments.

Second through holes 118 are formed through the stack by removing the first dielectric pillars 110, as shown in FIGS. 1F and 1F-1, in accordance with some embodiments. The removal process may be an isotropic etching process such as wet chemical etching, dry chemical etching or remote plasma etching, an anisotropic etching process such as dry plasma etching, and/or a combination thereof. The second through holes 118 expose the sacrificial layers 116, the strips 114 and the substrate 102, in accordance with some embodiments.

The second through holes 118 are arranged in a row/column configuration, in accordance with some embodiments. For example, rows of second through holes 118 extend in the X direction, and columns of second through holes 118 extend in the Y direction. In some embodiments, the second through holes 118 in neighboring two columns may be staggered with each other (e.g., not overlap in the X direction).

In some embodiments, the second through holes 118 also have the dimension D1 as measured in the X direction. In some embodiments, the dimension D1 is in a range from about 50 nm to about 300 nm. In some embodiments, the second through holes 118 also have a dimension D2 as measured in the Y direction. In some embodiments, the dimension D2 is in a range from about 50 nm to about 500 nm.

In some embodiments, the second through holes 118 have X-pitch $P_X$ (in the X direction), which is in a range from about 500 nm to about 10 um. In some embodiments, the second through holes 118 have Y-pitch $P_Y$ (in the Y direction), which is in a range from about . . . nm to about . . . nm. In some embodiments, the ratio of the Y-pitch $P_Y$ to the dimension D2 ($P_Y$/D2) is in a range from about 1 to about 50.

Figure 1G:
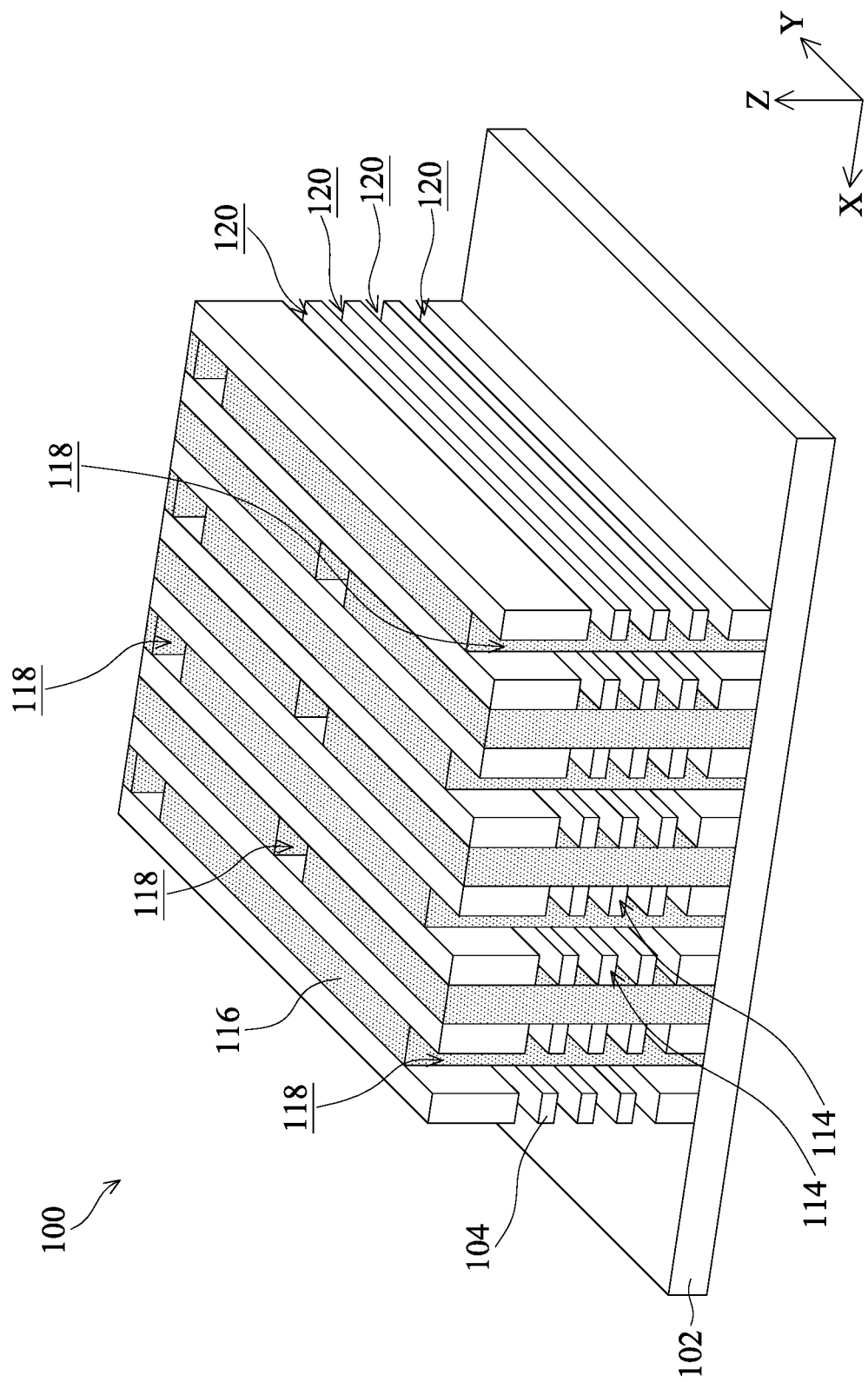

FIGS. 1G and 1G-1 illustrate the formation of gaps 120, in accordance with some embodiments.

An etching process is performed to removing the second dielectric layers 106 of the strips 114, thereby forming gaps 120, as shown in FIGS. 1G and 1G-1, in accordance with some embodiments. The gaps 120 are defined by the first dielectric layers 104 of the strips 114 and the sacrificial layers 116, in accordance with some embodiments. The etching process may be an isotropic etching process such as wet chemical etching, dry chemical etching or remote plasma etching, and/or a combination thereof.

During the etching process, an etchant is introduced into the second through holes 118 to laterally etch away the second dielectric layers (106 of FIG. 1F), thereby forming the gaps 120, in accordance with some embodiments. The first dielectric layers 104 and the sacrificial layers 116 have different etching selectivity than the second dielectric layers in the etching process, and thus the first dielectric layers 104 and the sacrificial layers 116 remain substantially unetched.

Figures 1, 1G, 2:
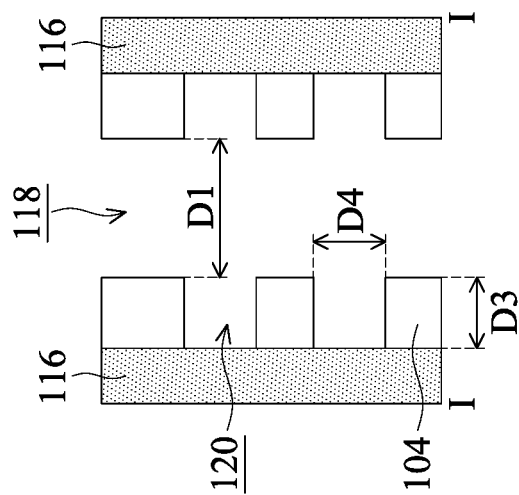
Figures 1, 1G:
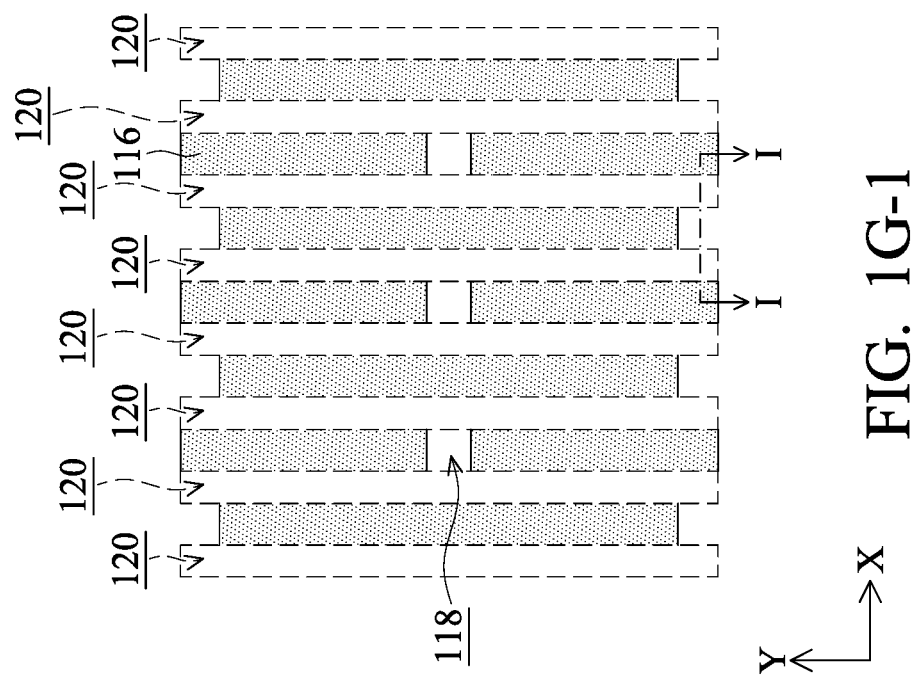

FIG. 1G-2 is a cross-sectional view taken along line I-I shown in FIG. 1G-1, in accordance with some embodiments. The gap 120 also has a dimension D3 as measured in the X direction. In some embodiments, the dimension D3 is in a range from about 50 nm to about 250 nm. The gap 120 has a dimension D4 (substantially the same as the thickness of the second dielectric layer 106) as measured in the Z direction. In some embodiments, the dimension D4 is in a range from about 10 nm to about 200 nm. In some embodiments, the dimension D3 and the dimension D4 of the gap 120 are less than the dimension D1 of the second through hole 118.

Figure 1H:
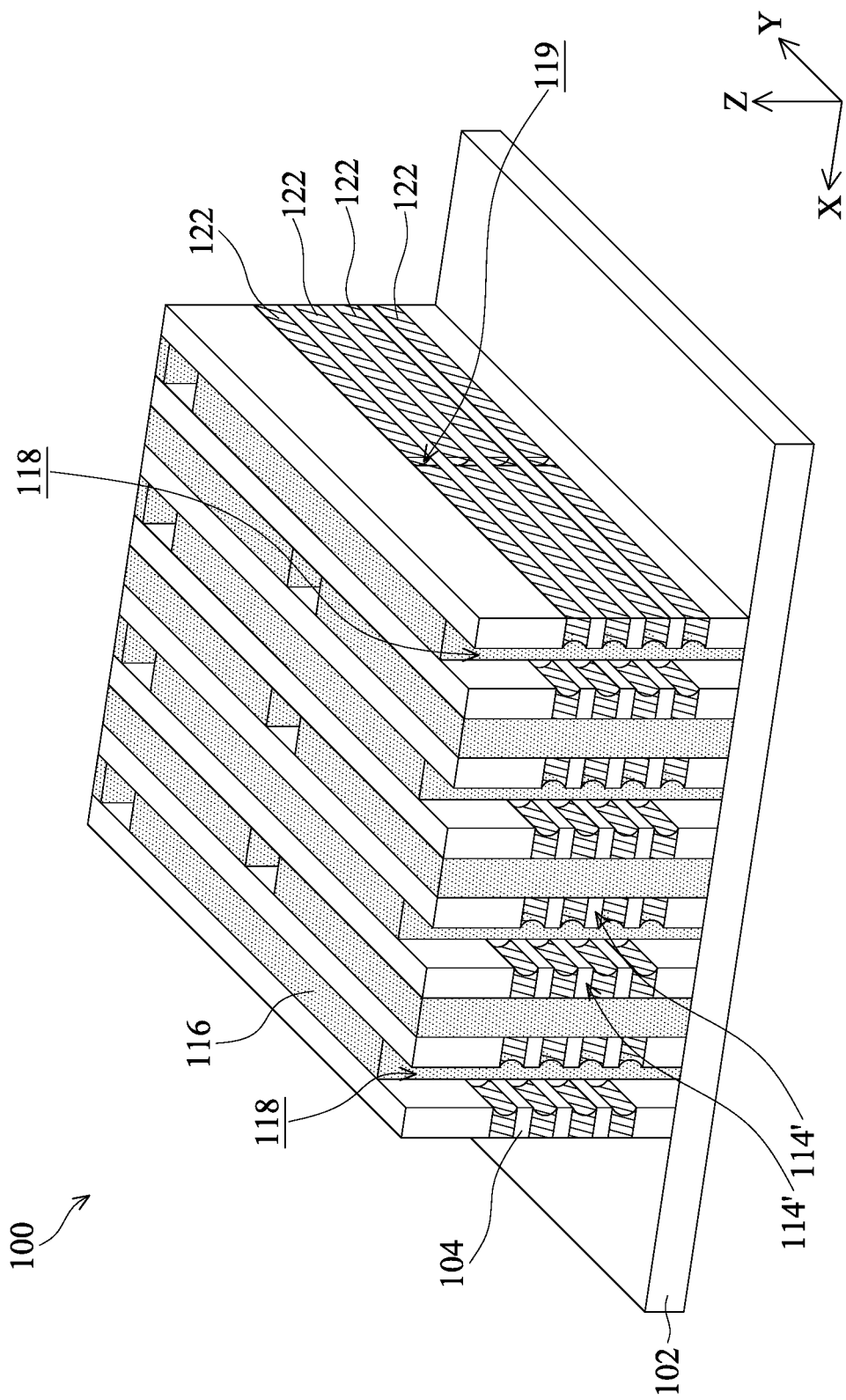
Figures 1, 1H, 2:
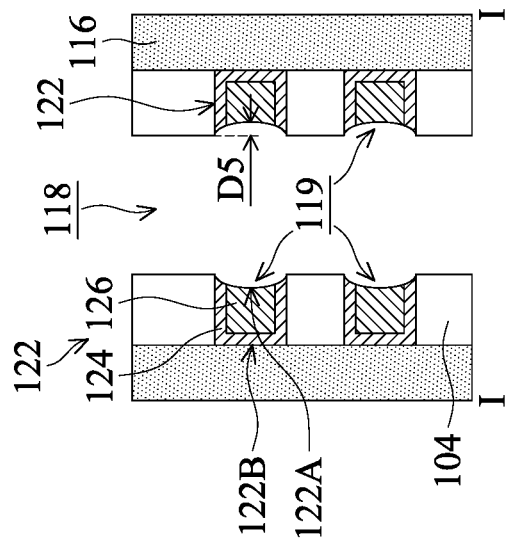

FIGS. 1H and 1H-1 illustrate the formation of first conductive lines 122, in accordance with some embodiments.

The first conductive lines 122 are formed in the gaps (120 of FIG. 1G), as shown in FIGS. 1H and 1H-1, in accordance with some embodiments. As a result, the second dielectric layers 106 of the strips are replaced with the first conductive lines 122, in accordance with some embodiments. The strips after replacement are denoted as strips 114'. The first conductive lines 122 extend in the Y direction and are separated from one another in the Z direction and the X direction, in accordance with some embodiments. The first conductive lines 122 are in contact with the first dielectric layers 104 and the sacrificial layers 116, in accordance with some embodiments. In some embodiments, the first conductive lines 122 are gate electrodes of memory transistors and function as word lines of the resulting semiconductor memory device, such as NOR-type flash memory.

FIGS. 1H-2 and 1H-3 are cross-sectional views taken along lines I-I and II-II shown in FIG. 1H-1 and illustrate the details of the formation of the first conductive lines 122, in accordance with some embodiments. In some embodiments, the first conductive lines 122 are made of one or more electrically conductive materials. In some embodiments, the first conductive lines 122 have a multi-layer structure including, for example, a barrier/adhesive layer, a metal bulk layer, another suitable layer, and/or a combination thereof.

For example, a barrier layer 124 is first deposited along the surfaces of the first dielectric layers 104 and the sacrificial layers 116 exposed from the gaps (120 of FIG. 1F) and the second through hole 118 to partially fill the gaps (120 of FIG. 1F) and the second through hole 118, in accordance with some embodiments. The barrier layer 124 is used to prevent the metal from the subsequently formed metal material from diffusing into the dielectric material (e.g., the first dielectric layers 104).

The barrier layer 124 may be made of titanium nitride (TiN), tantalum (Ta), tantalum nitride (TaN), titanium (Ti), cobalt tungsten (CoW), another suitable material, and/or a combination thereof. If the subsequently formed metal material does not easily diffuse into the dielectric material, the barrier layer may be omitted. The deposition process may be ALD, CVD, PVD, e-beam evaporation, ECP, ELD, another suitable method, or a combination thereof.

A metal bulk layer 126 is then deposited on the barrier layer 124, in accordance with some embodiments. In some embodiments, because the dimension D3 and the dimension D4 (FIG. 1G-2) of the gap (120 of FIG. 1F) are less than the dimension D1 (FIG. 1G-2) of the second through hole 118, the deposition process can be controlled such that the metal bulk layer 126 overfills the gaps 120 and partially fills the second through holes 118.

In some embodiments, the metal bulk layer 126 is made of conductive material with low resistance and good gap-fill ability, for example, tungsten (W), cobalt (Co), ruthenium (Ru), copper (Cu), aluminum (Al), nickel (Ni), titanium (Ti), tantalum (Ta), molybdenum (Mo), another suitable metal material, and/or a combination thereof. The deposition process may be ALD, CVD, PVD, e-beam evaporation, ECP, ELD, another suitable method, or a combination thereof.

After the deposition of the metal bulk layer 126, an etching back process is performed to remove portions of the barrier layer 124 and the metal bulk layer 126 outside the gaps (120 of FIG. 1F). The etching process may be an isotropic etching process such as wet chemical etching, dry chemical etching or remote plasma etching, and/or a combination thereof. Because the second through holes 118 are partially filled, during the etching process, an etchant is introduced into the remainders of the second through holes 118 to laterally etch away the barrier layer 124 and the metal bulk layer 126 until the sidewalls of the first dielectric layers 104 originally covered by the barrier layer 124 and the metal bulk layer 126 are exposed from the second through holes 118 again, as shown in FIG. 1H-2, in accordance with some embodiments. The portions of the barrier layer 124 and the metal bulk layer 126 within the gaps (120 of FIG. 1F) in combination serve as the first conductive lines 122, in accordance with some embodiments.

In some embodiments, the first conductive lines 122 also have the maximum dimension D3 as measured in the X direction. In some embodiments, the dimension D3 is in a range from about 150 nm to about 500 nm. The first conductive lines 122 have sidewalls 122B which are interfaced with (or covered by) the sacrificial layers 116, and thus the sidewalls 122B remain substantially flat after the etching process, as shown in FIGS. 1H-1, 1H-2 and 1H-2, in accordance with some embodiments. Channel layers will be formed on the substantially flat sidewalls 122B of the first conductive lines 122, in accordance with some embodiments.

In some embodiments, due to the characteristics of the etching process, in the etching back process, the portions of the first conductive lines 122 exposed from the second through holes 118 may be laterally recessed, e.g., by a maximum depth D5, thereby be forming notches 119, as shown in FIG. 1H-2. In some embodiments, the depth D5 is less than 50 nm, e.g., in a range from about 0 nm to about 50 nm. In some embodiments, a ratio (D5/D3) of depth D5 of the notches 119 to the dimension D3 of the first conductive lines 122 is in a range from about 0.5 to about 0.95.

The sidewalls of the first conductive lines 122 have concave portions 122A that are exposed from the second through holes 118, as shown in FIGS. 1H-1 and 1H-2. Channel layers would not be formed on the concave portion 122A of the sidewalls of the first conductive lines 122, in accordance with some embodiments.

Therefore, by forming the sacrificial layers 116 and the second through holes 118, the first conductive lines 122 may be formed with sidewalls, most of which are substantially flat and a small part of which are concave. As a result, the first conductive lines 122 may be formed with a greater cross-sectional area (in the X-Y plane), thereby improving the performance (e.g., lower resistance) of the resulting semiconductor memory device.

Figures 1, 1H, 2, 3:
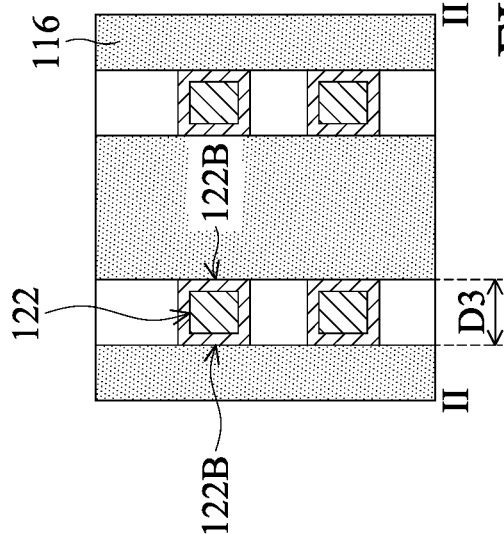
Figures 1, 1H:
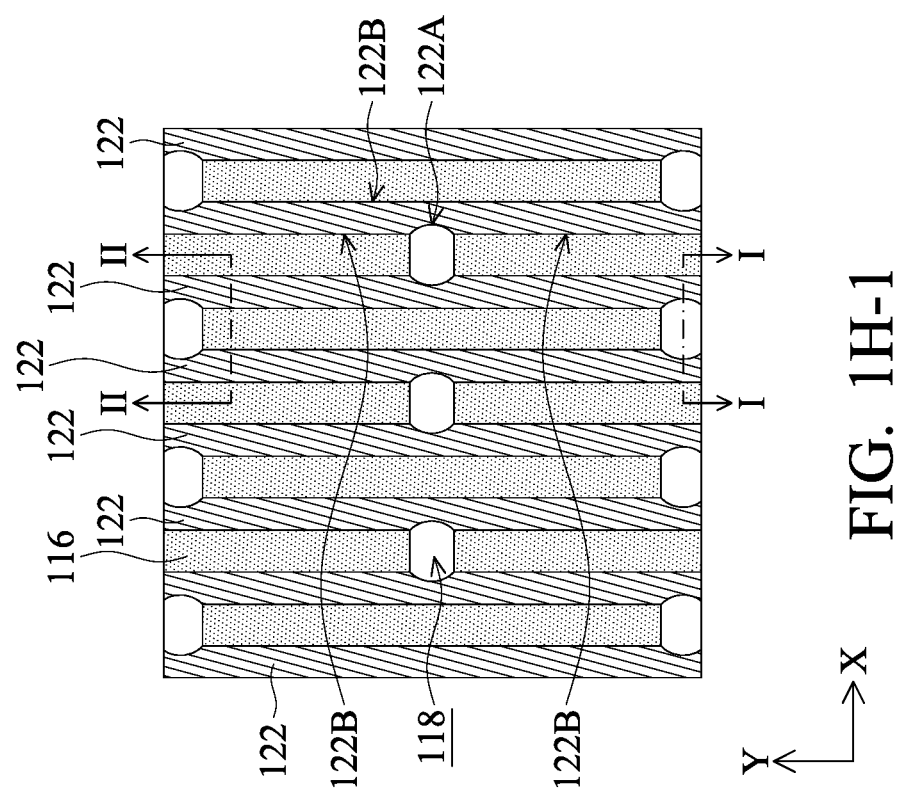
Figure 1I:
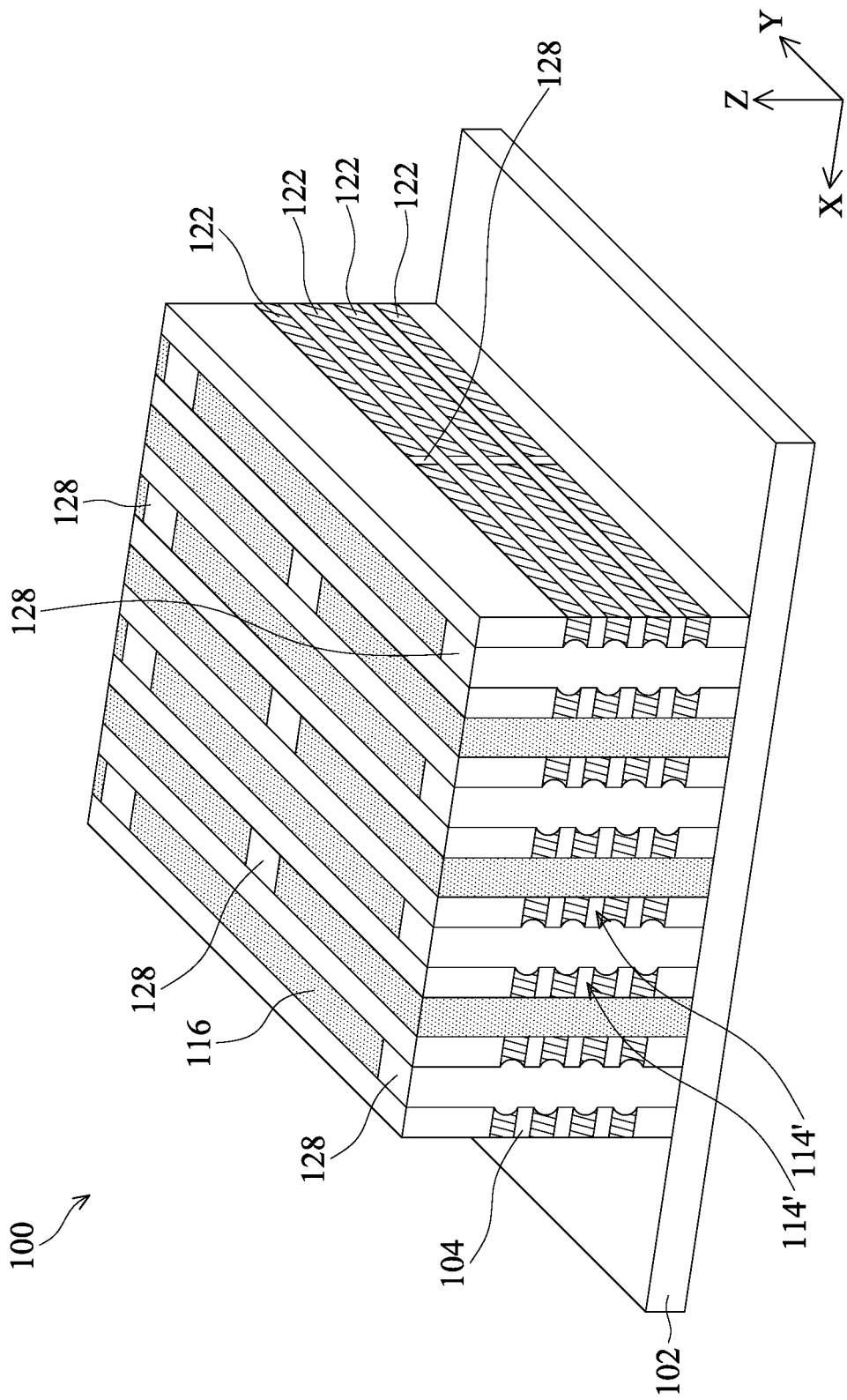
Figures 1, 1I, 2:
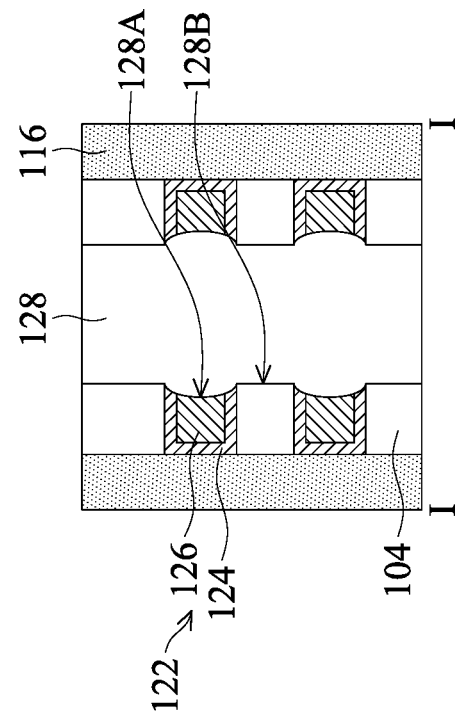
Figures 1, 1I:
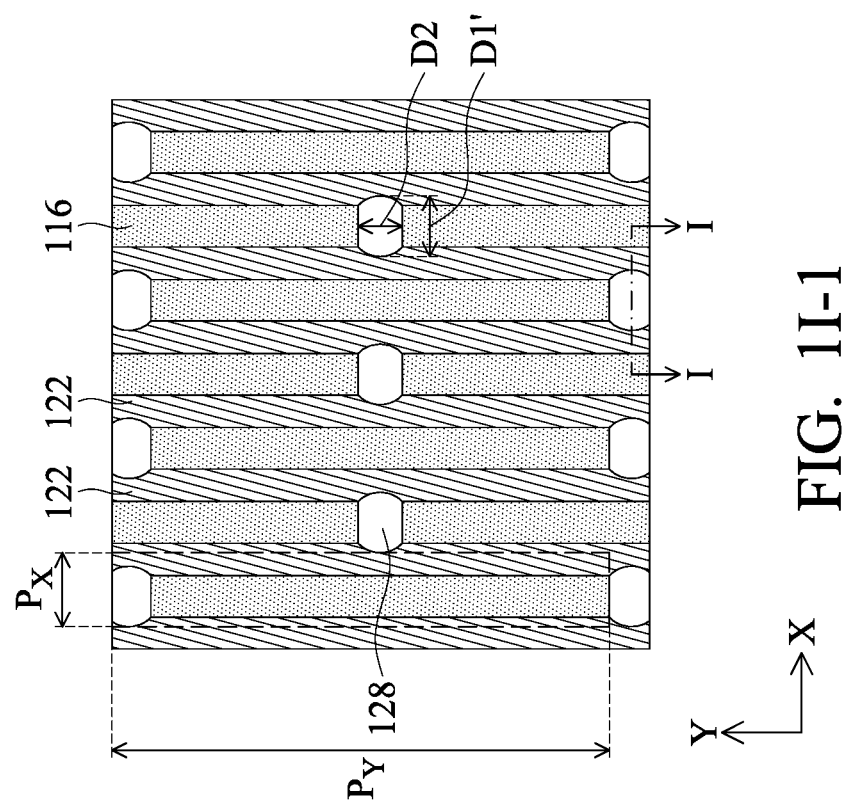

FIGS. 1I and 1I-1 illustrate the formation of second dielectric pillars 128, in accordance with some embodiments.

Second dielectric pillars 128 are formed in the second through holes (118 of FIG. 1H), as shown in FIGS. 1I and 1I-1, in accordance with some embodiments. The second dielectric pillars 128 are in contact with the first dielectric layers 104 and the first conductive lines 122 of the strips 114', the sacrificial layers 116 and the substrate 102, in accordance with some embodiments. The second dielectric pillars 128 are configured to supports strips 114' from collapsing and/or wiggling in and after a subsequent etching process, in accordance with some embodiments.

In some embodiments, the second dielectric pillars 128 are made of dielectric material such as silicon oxide (SiO$_2$), silicon oxynitride (SiON), silicon nitride (SiN), silicon oxycarbide (SiOC), silicon carbon nitride (SiCN), silicon oxycarbonitride (SiOCN), or a combination thereof. In some embodiments, the second dielectric pillars 128 are made of the same material as the first dielectric layers 104, e.g., an oxide-based dielectric material (such as silicon oxide).

In some embodiments, the second dielectric pillars 128 are formed by depositing a dielectric material to overfill the second through holes (118 of FIG. 1H), and then planarizing the dielectric material to remove the portion of the dielectric material formed above the strips 114' until the sacrificial layers 116 are exposed. The deposition process may be ALD, CVD (such as LPCVD, PECVD, HDP-CVD, HARP, and FCVD), another suitable technique, and/or a combination thereof. The planarizing process may be an etching back process and/or chemical mechanical polishing (CMP).

The second dielectric pillars 128 are arranged in a row/column configuration, in accordance with some embodiments. For example, rows of second dielectric pillars 128 extend in the X direction, and columns of second dielectric pillars 128 extend in the Y direction. In some embodiments, the second dielectric pillars 128 in neighboring two columns may be staggered with each other (e.g., not overlap in the X direction).

In some embodiments, the second dielectric pillars 128 have the maximum dimension Dr as measured in the X direction. In some embodiments, the dimension D1' is in a range from about 50 nm to about 300 nm. In some embodiments, the second dielectric pillars 128 also have the dimension D2 as measured in the Y direction. In some embodiments, the dimension D2 is in a range from about 50 nm to about 500 nm.

In some embodiments, the second dielectric pillars 128 are arranged at an X-pitch $P_X$ (in the X direction), which is in a range from about 150 nm to about 500 nm. In some embodiments, the second dielectric pillars 128 are arranged at a Y-pitch $P_Y$ (in the Y direction), which is in a range from about 500 nm to about 10 um. In some embodiments, the ratio of the Y-pitch $P_Y$ to the dimension D2 ($P_Y$/D2) is in a range from about 1 to about 50. If the ratio ($P_Y$/D2) or the Y-pitch $P_Y$ is too small, the areal density of memory cells may decrease. If the ratio ($P_Y$/D2) or the Y-pitch $P_Y$ is too large, the risk that the strips 114' including the first conductive lines 122 collapse and/or wiggle may increase.

FIG. 1I-2 is a cross-sectional view taken along lines I-I shown in FIG. 1I-1, in accordance with some embodiments. The second dielectric pillars 128 include protruding portions filled in the notches (of 119 FIG. 1H-2), in accordance with some embodiments. The protruding portions of the second dielectric pillars 128 have convex side surfaces 128A that mate and are interfaced with the concave portions 122A of the sidewalls of the first conductive lines 122, as shown in FIG. 1I-2, in accordance with some embodiments. In some embodiments, the convex side surfaces 128A are in contact with both the barrier layer 124 and the metal bulk layer 126 of the first conductive lines 122.

The second dielectric pillars 128 also have substantially flat side surfaces 128B interfaced with the first dielectric layers 104, in accordance with some embodiments. The convex side surfaces 128A and the substantially flat side surfaces 128B are alternately arranged, in accordance with some embodiments.

Figure 1J:
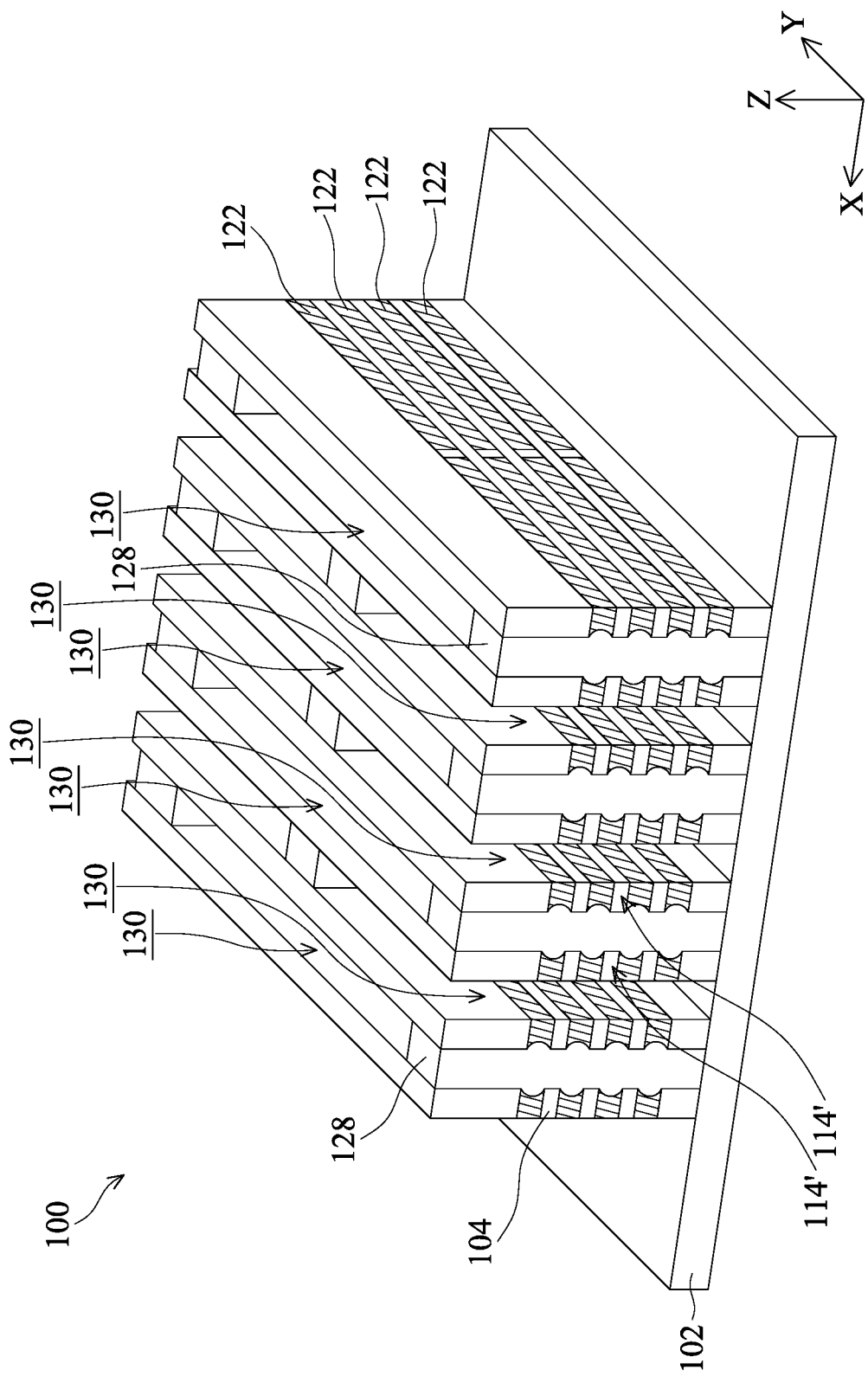
Figures 1, 1J:
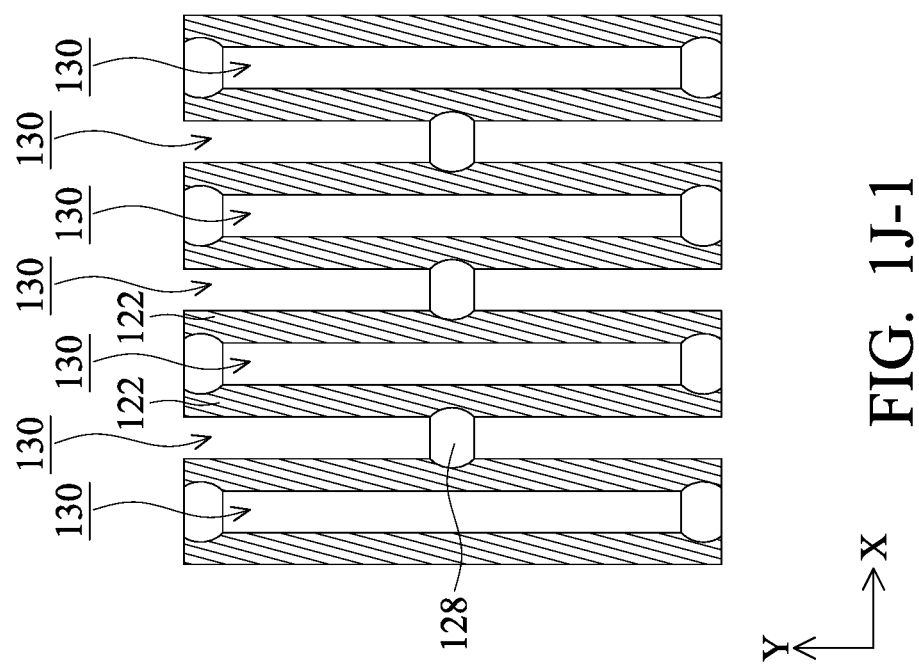

FIGS. 1J and 1J-1 illustrate the removal of the sacrificial layers 116, in accordance with some embodiments.

An etching process is performed to remove the sacrificial layers (116 of FIG. 1I), thereby forming second trenches 130, as shown in FIGS. 1J and 1J-1, in accordance with some embodiments. The etching process may be an anisotropic etching process such as dry plasma etching, an isotropic etching process such as dry chemical etching, remote plasma etching, wet chemical etching, and/or a combination thereof.

Each of the second dielectric pillars 128 may support the neighboring two strips 114', thereby decreasing the risk of collapsing and/or wiggling of the strips 114', in accordance with some embodiments. As a result, the manufacturing yield of the resulting semiconductor memory device may improve.

In some embodiments, the second trenches 130 extend in the Y direction and are formed aligned with the columns of second dielectric pillars 128. In some embodiments, each of the second trenches 130 is formed between and exposes neighboring two second dielectric pillars 128 in a column. In some embodiments, the second trenches 130 also expose the first dielectric layers 104 and the first conductive lines 122 of the strips 114'.

Figure 1K:
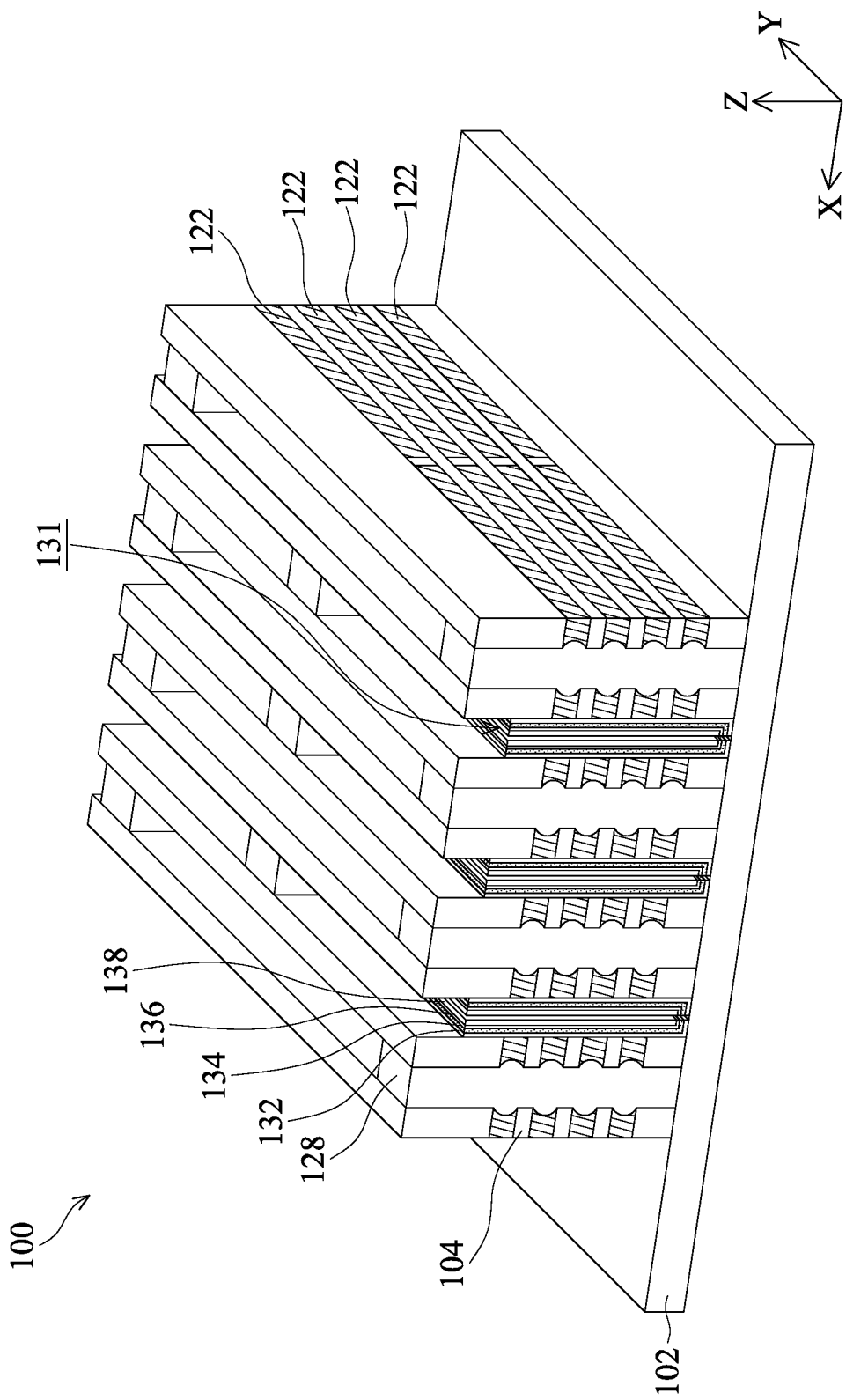
Figures 1, 1K, 2:
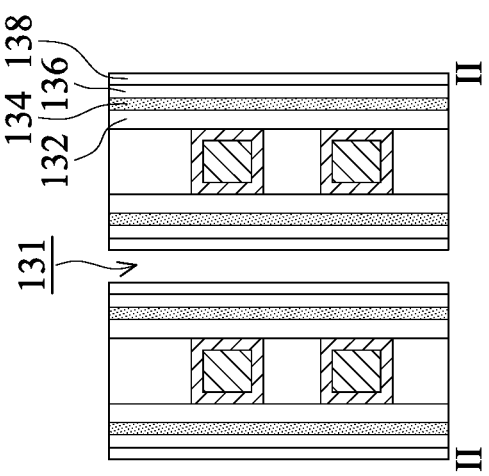
Figures 1, 1K, 2, 3:
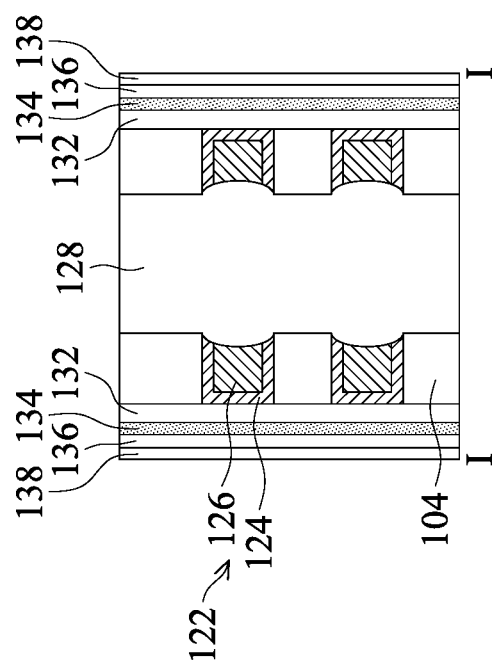
Figures 1, 1K:
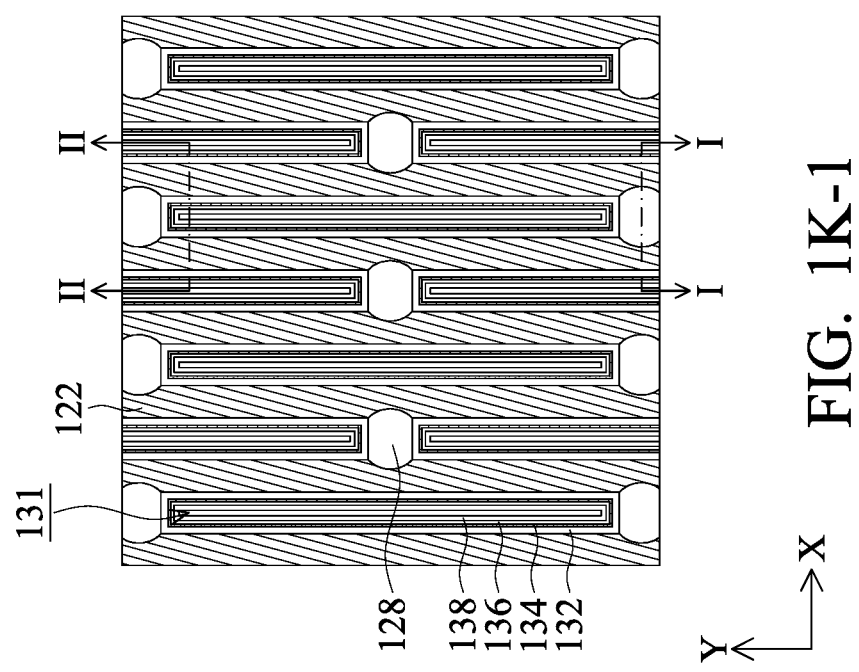

FIGS. 1K and 1K-1 illustrate the formation of ferroelectric (FE) layers 132, channel layers 134, insulating layers 136 and capping layer 138, in accordance with some embodiments.

Ferroelectric layers 132, channel layers 134, insulating layers 136 and capping layers 138 are sequentially deposited over the semiconductor memory structure 100 to partially fill the second trenches (130 of FIG. 1J), as shown in FIGS. 1K and 1K-1, in accordance with some embodiments. The remaining portions of the second trenches (130 of FIG. 1J) are denoted as 131.

In some embodiments, the ferroelectric layers 132 are made of ferroelectric material such as hafnium oxide (HfO), zirconium oxide (ZrO), hafnium zirconium oxide (HfZrO), another suitable material, or a combination thereof. In some embodiments, the ferroelectric layers 132 are deposited along the sidewalls and bottom surfaces of the second trenches (130 of FIG. 1J) using ALD, CVD (such as LPCVD, PECVD and HDP-CVD), another suitable technique, and/or a combination thereof.

In some embodiments, the channel layers 134 are made of a semiconductor material such as indium gallium oxide (InGaO), indium gallium zirconium oxide (InGaZrO), indium gallium zinc oxide (IGZO), polysilicon, germanium, another suitable material, or a combination thereof. In some embodiments, the channel layers 134 are deposited over the ferroelectric layers 132 using ALD, CVD (such as LPCVD, PECVD and HDP-CVD), another suitable technique, and/or a combination thereof.

In some embodiments, the insulating layers 136 are made of dielectric material such as silicon oxide ($SiO_2$), silicon oxynitride (SiON), silicon nitride (SiN), silicon oxycarbide (SiOC), silicon carbon nitride (SiCN), silicon oxycarbonitride (SiOCN), aluminum oxide ($Al_2O_3$), zirconium dioxide ($ZrO_2$), hafnium oxide ($HfO_2$) yttrium oxide ($Y_2O_3$), lanthanum oxide ($La_2O_3$), another suitable material, and/or a combination thereof. In some embodiments, the insulating layers 136 are deposited over the channel layers 134 using ALD, CVD (such as LPCVD, PECVD and HDP-CVD), another suitable technique, and/or a combination thereof.

In some embodiments, the capping layers 138 are made of dielectric material such as silicon oxide ($SiO_2$), silicon oxynitride (SiON), silicon nitride (SiN), silicon oxycarbide (SiOC), silicon carbon nitride (SiCN), silicon oxycarbonitride (SiOCN), another suitable material, and/or a combination thereof. In some embodiments, the capping layers 138 are made of the same material as the first dielectric layers 104, e.g., an oxide-based dielectric material (such as silicon oxide). In some embodiments, the capping layers 138 are deposited over the insulating layers 136 using ALD, CVD (such as LPCVD, PECVD and HDP-CVD), another suitable technique, and/or a combination thereof.

After the material for the capping layers 138 is deposited, an etching back process is performed on the ferroelectric layers 132, the channel layers 134, the insulating layers 136, and the capping layers 138 to open the bottoms of the second trenches 131, so that the second trenches 131 extend to the substrate 102, in accordance with some embodiments. The etching process may be an anisotropic etching process such as dry plasma etching, an isotropic etching process such as dry chemical etching, remote plasma etching or wet chemical etching, and/or a combination thereof.

The etching back process also removes portions of the ferroelectric layers 132, the channel layers 134, the insulating layers 136 and the capping layers 138 formed above the upper surfaces of the strips 114', and further recesses portions of the ferroelectric layers 132, the channel layers 134, the insulating layers 136 and the capping layers 138 formed in the second trenches 131, in accordance with some embodiments.

In some embodiments, each of the ferroelectric layer 132, the channel layer 134, the insulating layer 136 and the capping layer 138 has a closed-loop profile, as shown in FIG. 1K-1.

FIGS. 1K-2 and 1K-3 are cross-sectional views taken along lines I-I and II-II shown in FIG. 1K-1, in accordance with some embodiments. The channel layers 134 are formed along the substantially flat sidewalls 122B of the first conductive lines 122, as shown in FIGS. 1K, 1K-1, 1K-2 and 1K-3, in accordance with some embodiments. Because the concave portions 122A of the sidewalls of the first conductive lines 122 are covered by the second dielectric pillars 128, the channel layers 134 are not formed along the concave portions 122A, in accordance with some embodiments. Therefore, the channel layers 134 may also have flat profiles, thereby improving the performance of the resulting semiconductor memory device.

Figure 1L:
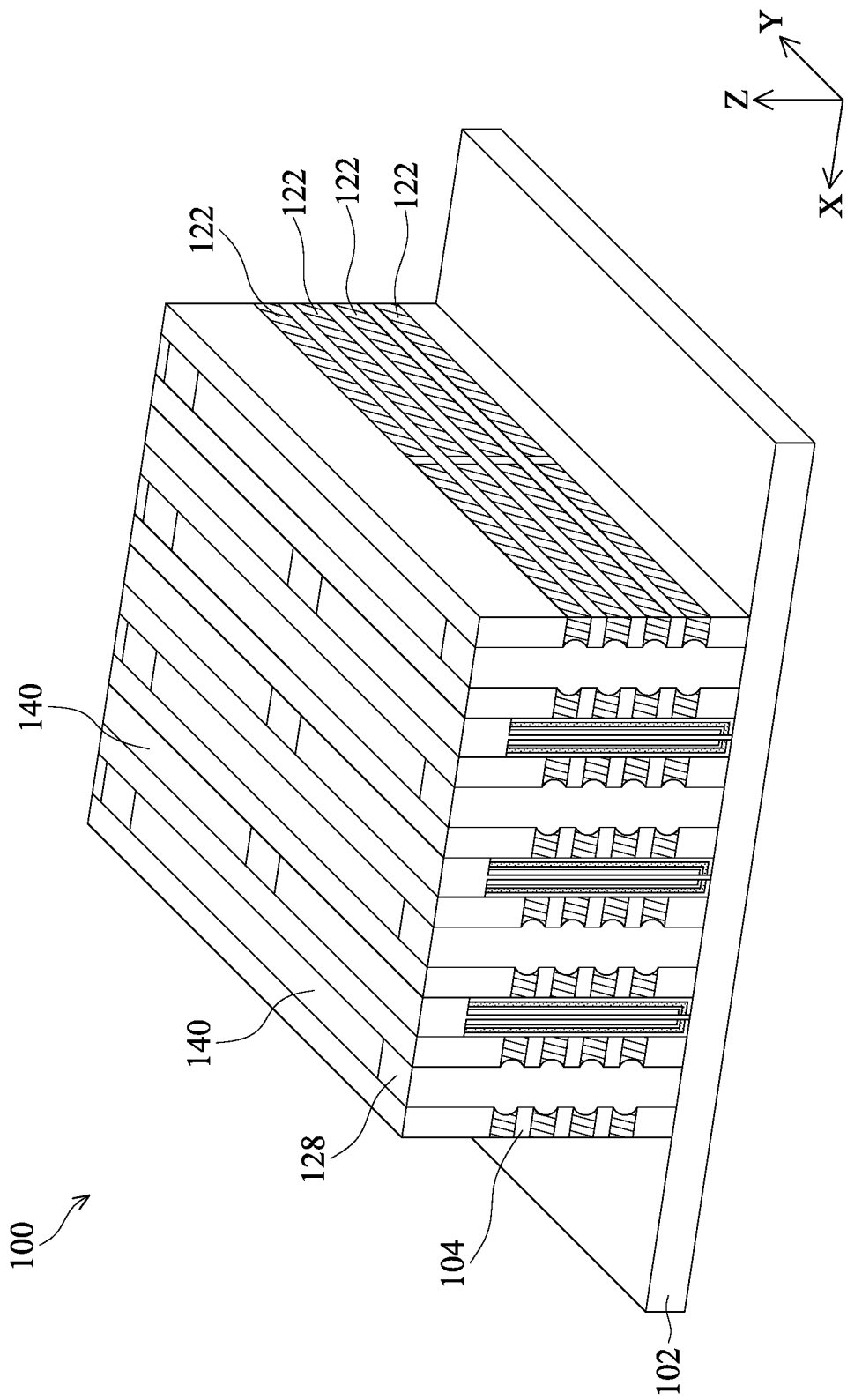
Figures 1, 1L:
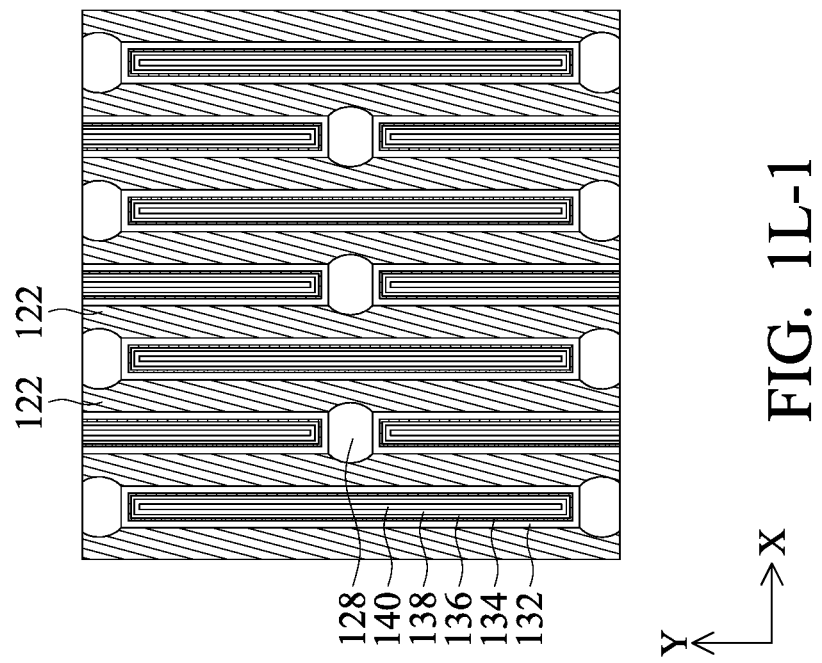

FIGS. 1L and 1L-1 illustrate the formation of fill layers 140, in accordance with some embodiments.

Fill layers 140 are formed over the semiconductor memory structure 100 to fill in the second trenches (131 of FIG. 1K), as shown in FIGS. 1L and 1L-1, in accordance with some embodiments. In some embodiments, the fill layers 140 are made of dielectric material such as silicon oxide ($SiO_2$), silicon oxynitride (SiON), silicon nitride (SiN), silicon oxycarbide (SiOC), silicon carbon nitride (SiCN), silicon oxycarbonitride (SiOCN), another suitable material, and/or a combination thereof. In some embodiments, the fill layers 140 are made of the same material as the first dielectric layers 104, e.g., an oxide-based dielectric material (such as silicon oxide).

In some embodiments, the fill layers 140 are formed by depositing a dielectric material to overfill the second trenches 131, and then planarizing the dielectric material to remove the portion of the dielectric material formed above the strips. The deposition process may be ALD, CVD (such as LPCVD, PECVD, HDP-CVD, HARP, and FCVD), another suitable technique, and/or a combination thereof. The planarizing process may be an etching back process and/or chemical mechanical polishing (CMP).

Figure 1M:
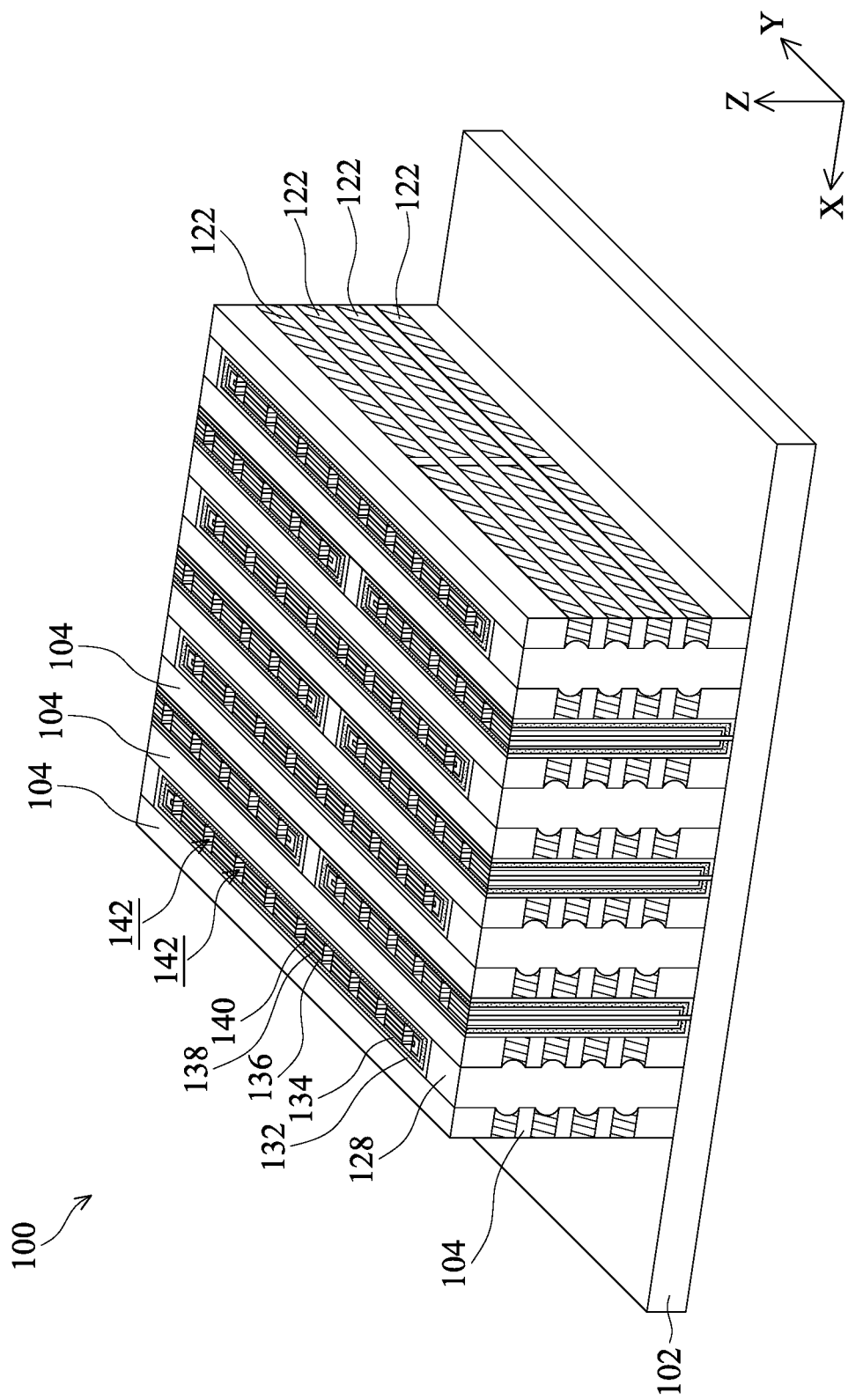
Figures 1, 1M, 2:
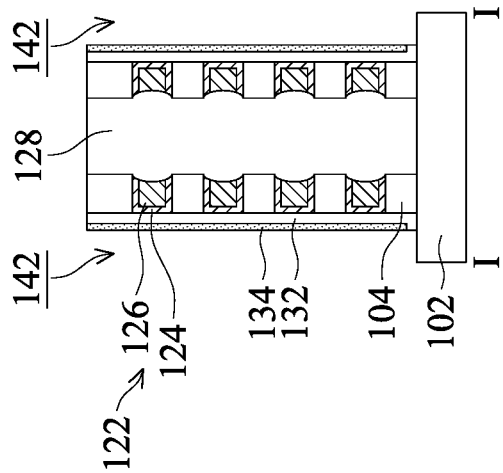
Figures 1, 1M, 2, 3:
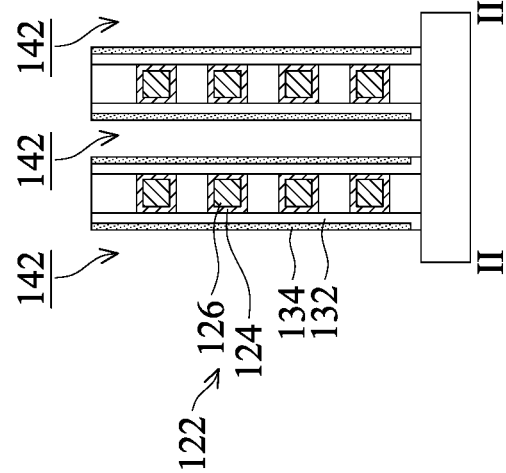
Figures 1, 1M:
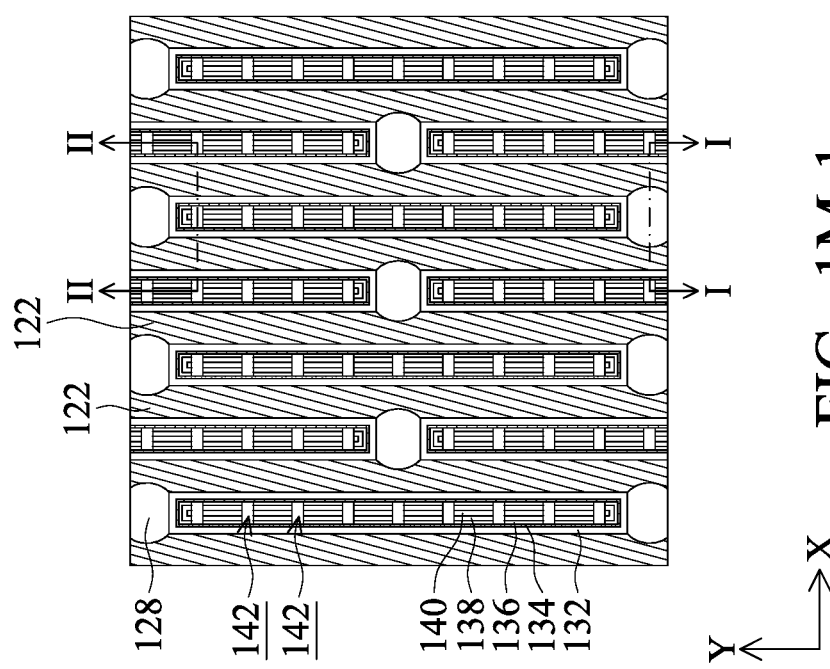

FIGS. 1M and 1M-1 illustrate the formation of third through holes 142, in accordance with some embodiments. FIGS. 1M-2 and 1M-3 are cross-sectional views taken along lines I-I and II-II shown in FIG. 1M-1, in accordance with some embodiments.

After the fill layers 140 are formed, a planarization process is performed on the semiconductor memory structure 100 until the ferroelectric layers 132, the channel layers 134, the insulating layers 136 and the capping layers 138 are exposed, in accordance some embodiments. The planarizing process may be an etching back process and/or chemical mechanical polishing (CMP).

Third through holes 142 are then formed through the fill layers 140, the capping layers 138, the insulating layers 136, as shown in FIGS. 1M, 1M-1, 1M-2 and 1M-3, in accordance with some embodiments. In some embodiments, the closed-loop profiles of the insulating layer 136 and the capping layer 138 are cut off by the third through holes 142 while the closed-loop profiles of the ferroelectric layer 132 and the channel layer 134 remain intact (or continuous), as shown in FIG. 1M-1. In some embodiments, the third through holes 142 expose the channel layers 134 and the substrate 102, in accordance with some embodiments.

In some embodiments, the formation of the third through holes 142 includes forming a patterned mask layer (not shown) having opening patterns corresponding to the third through holes 142 over the semiconductor memory structure 100, and then etching the semiconductor memory structure 100 using the patterned mask layer to transfer the opening patterns into the fill layers 140, the capping layers 138, the insulating layers 136 until the substrate 102 is exposed. In some embodiments, the patterned mask layer is a patterned photoresist layer which is formed by a photolithography process. The etching process may be an anisotropic etching process such as dry plasma etching, an isotropic etching process such as dry chemical etching, remote plasma etching, wet chemical etching, and/or a combination thereof.

In some alternative embodiments, the patterned mask layer is a patterned hard mask layer, which is formed by depositing a dielectric layer, forming a patterned photoresist layer over the dielectric layer, and etching the dielectric layer to transfer the opening patterns of the photoresist layer into the dielectric layer. The patterned mask layer may be removed during the etching process or by an additional process (such as etching, wet strip and/or ashing).

The third through holes 142 are arranged in a row/column configuration, in accordance with some embodiments. For example, rows of third through holes 142 extend in the X direction, and columns of third through holes 142 extend in the Y direction. In some embodiments, the third through holes 142 are not formed at the positions where the second dielectric pillars 128 have been disposed. Although FIG. 1M-1 illustrates that nine third through holes 142 are formed between neighboring two second dielectric pillars 128, the number of the third through holes 142 between neighboring two second dielectric pillars 128 is not limited thereto and may depend on design demand and/or performance consideration.

Figure 1N:
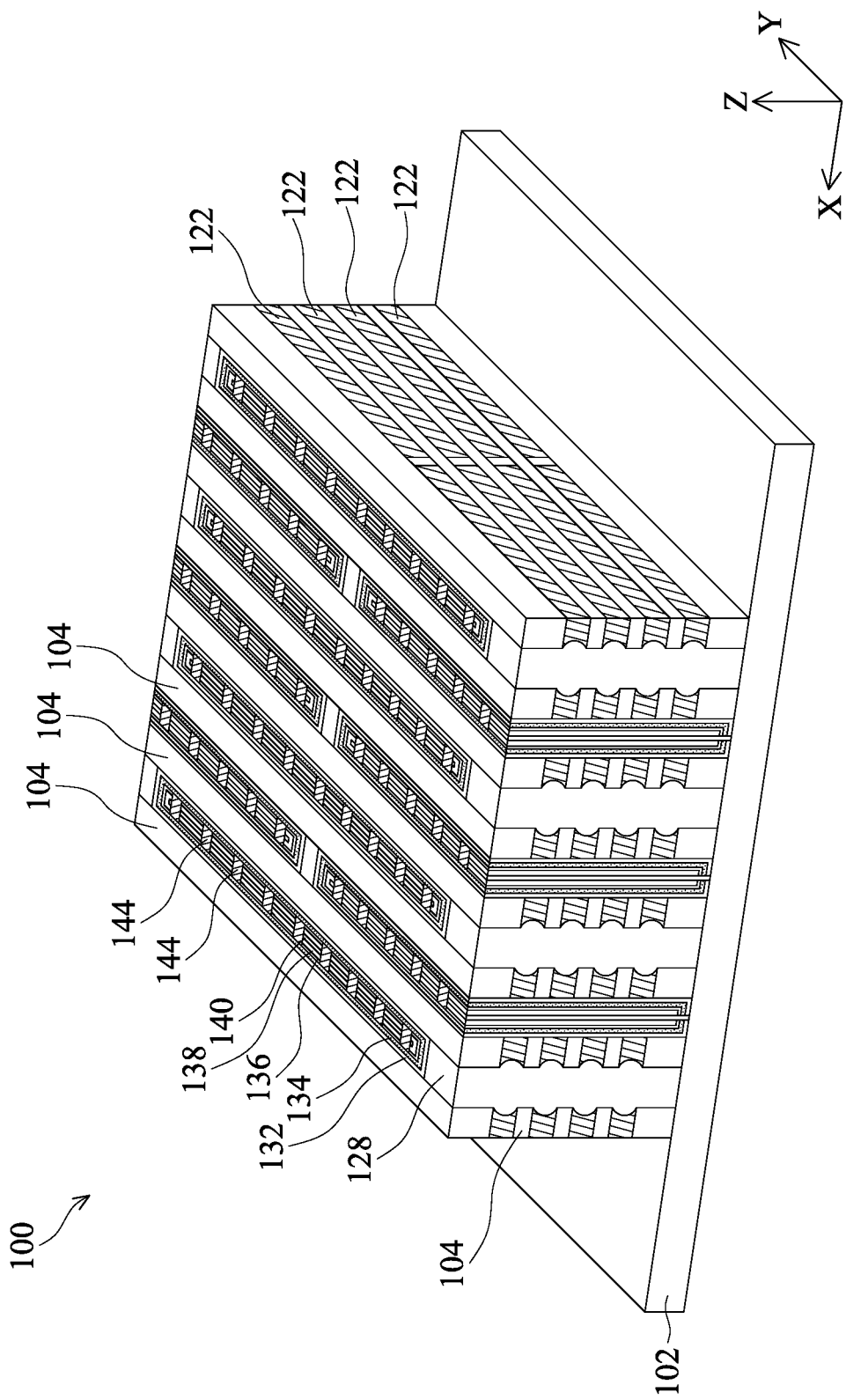
Figures 1, 1N, 2:
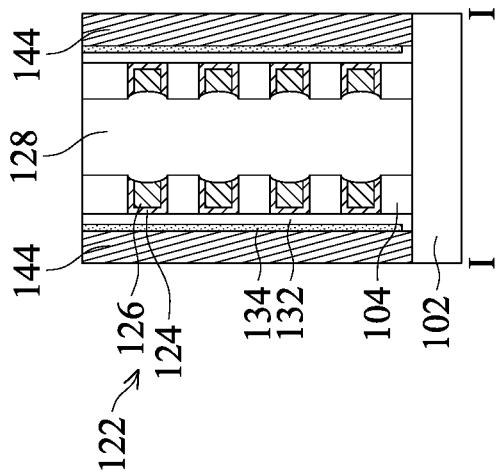
Figures 1, 1N, 2, 3:
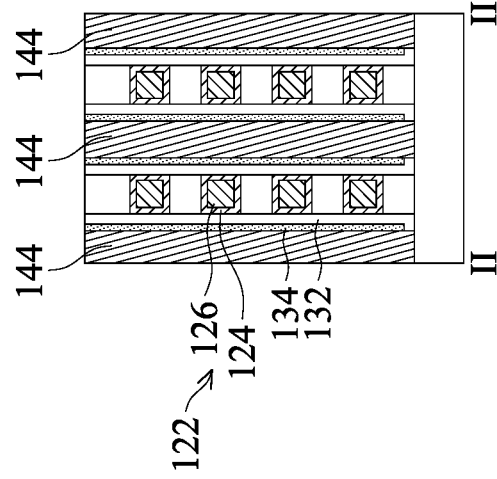
Figures 1, 1N:
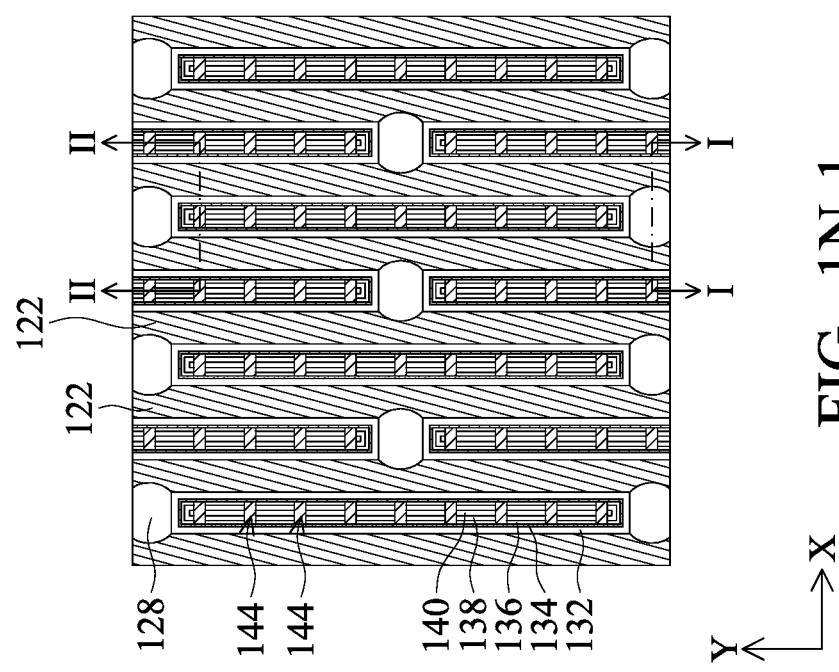
Figure 2:
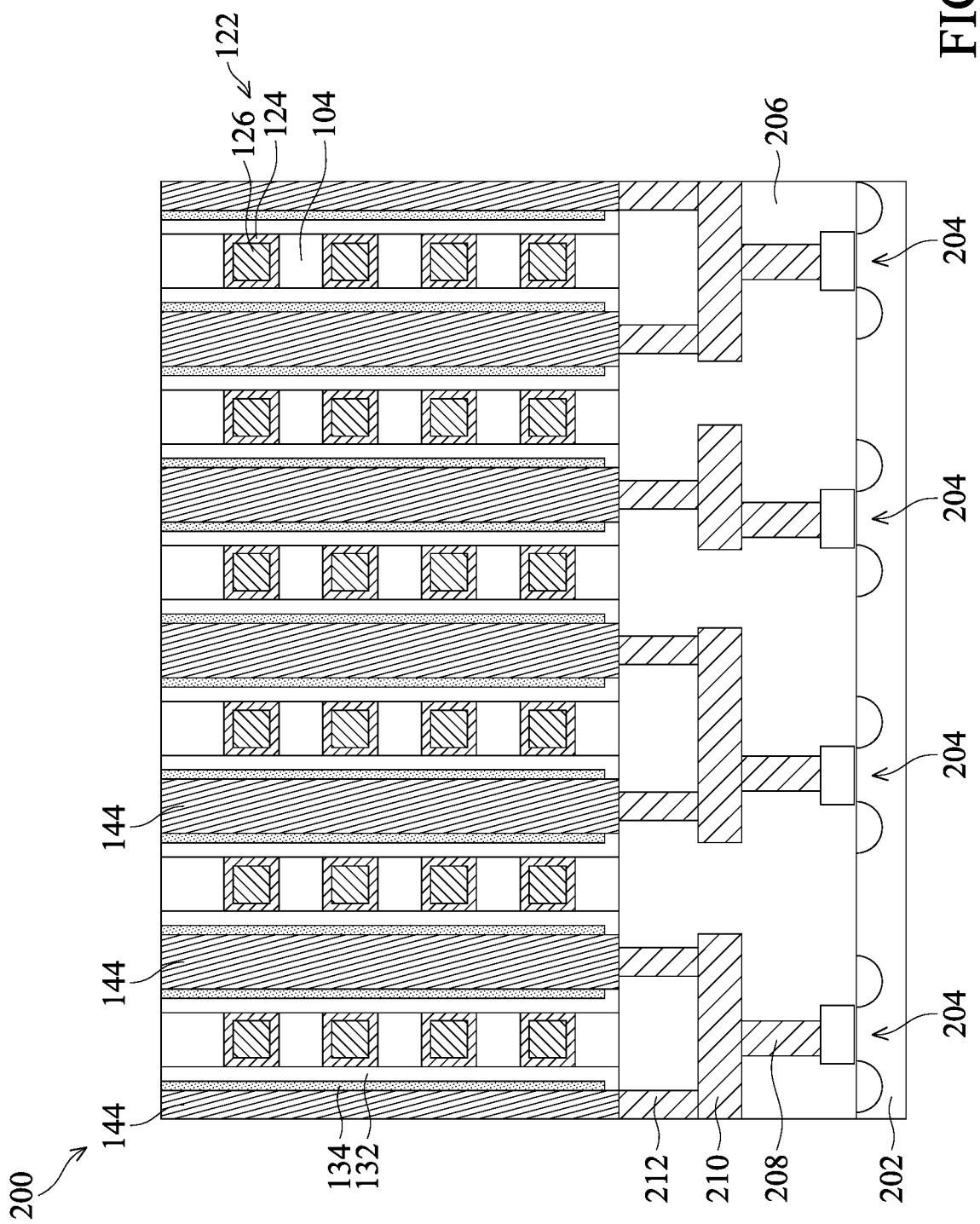

FIGS. 1N and 1N-1 illustrate the formation of second conductive lines 144, in accordance with some embodiments. FIGS. 1N-2 and 1N-3 are cross-sectional views taken along lines I-I and II-II shown in FIG. 1N-1, in accordance with some embodiments.

Second conductive lines 144 are formed in the third through holes (142 of FIG. 1M), as shown in FIGS. 1N, 1N-1, 1N-2 and 1N-3, in accordance with some embodiments. The second conductive lines 144 extend in the Z direction and are in contact with the channel layers 134 and the substrate 102, in accordance with some embodiments. In some embodiments, the second conductive lines 144 are source/drain electrodes of memory transistors and function as source lines or bit lines of the resulting semiconductor memory device, such as NOR-type flash memory.

In some embodiments, the second conductive lines 144 are made of one or more electrically conductive material, for example, tungsten (W), cobalt (Co), ruthenium (Ru), copper (Cu), aluminum (Al), nickel (Ni), titanium (Ti), tantalum (Ta), molybdenum (Mo), titanium nitride (TiN), tantalum (Ta), tantalum nitride (TaN), titanium (Ti), cobalt tungsten (CoW), another suitable material, and/or a combination thereof.

The formation of the second conductive lines 144 includes depositing conductive material for the second conductive lines 144 to overfill the third through holes (142 of FIG. 1M), and then planarizing the conductive material to remove the portion of the conductive material formed above the ferroelectric layers 132, the channel layers 134, the insulating layers 136 and the capping layers 138 until the ferroelectric layers 132, the channel layers 134, the insulating layers 136 and the capping layers 138 are exposed, in accordance with some embodiments. The deposition process may be ALD, CVD, PVD, e-beam evaporation, ECP, ELD, another suitable method, or a combination thereof. The planarizing process may be an etching back process and/or chemical mechanical polishing (CMP).

In some embodiments, the first conductive lines 122, the ferroelectric layers 132, the channel layers 134, and the second conductive lines 144 combine to form memory transistors (e.g., flash memory transistors), thereby functioning as memory cells. The memory cells are operable for data storage and arranged in the X, Y and Z directions to form a memory cell array, in accordance with some embodiments. In some embodiments, the second conductive lines 144 are electrically connected to the peripheral circuits formed in the substrate 102.

Additional CMOS manufacturing processes may be formed, in accordance with some embodiments. For example, inter metal dielectric layer and metal layers and vias may be formed over the semiconductor memory structure 100, in accordance with some embodiments.

As described above, by forming the first and second dielectric pillars 110 and 128, the risk of collapsing and/or wiggling of the strips 114 and 114' may decreases. As a result, the manufacturing yield of the resulting semiconductor memory device may improve. In addition, by forming the sacrificial layers 116, the first conductive lines 122 may be formed with substantially flat sidewalls, and the channel layers 134 formed thereon also have substantially flat profiles. As a result, the performance of the resulting semiconductor memory device may improve.

FIG. 2 is a cross-sectional view of a semiconductor memory structure 200, in accordance with some embodiments of the disclosure. The embodiments of the FIG. 2 are similar to the embodiments of the FIGS. 1N, 1N-1, 1N-2 and 1N-3, except that FIG. 2 further illustrates that a semiconductor substrate, an interconnect structure over the semiconductor substrate, and a memory cell array over the semiconductor substrate.

A semiconductor substrate 202 is provided, as shown in FIG. 2, in accordance with some embodiments. In some embodiments, the semiconductor substrate 202 is a silicon substrate. In some embodiments, the semiconductor substrate 202 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

Peripheral circuits 204 are formed on the semiconductor substrate 202, as shown in FIG. 2, in accordance with some embodiments. The peripheral circuits 204 may make up a control circuit for operating an array of memory cells formed vertically above. The peripheral circuits 204 may include, but is not limited to, voltage boost circuitry, page buffer circuitry, column decoder, row decoder, error correction circuitry, write assist circuitry, interface circuitry including for interfacing between types of memory cells, bus control circuitry, and the like.

In some embodiments, the peripheral circuits 204 include MOSFETs such as p-type MOSFETs (P-MOSFET) or n-type MOSFETs (N-MOSFET). The MOSFET may be planar-type transistors, fin-type transistors (e.g., FinFETs), and/or another applicable transistor. In some embodiments, the peripheral circuits 204 are planar-type transistors. The peripheral circuits 204 each include a gate structure formed over the upper surface of the semiconductor substrate 202 and source/drain regions formed in or embedded at least partially in the semiconductor substrate 202 on opposite sides of the gate structure, in accordance with some embodiments.

In some embodiments, the gate structure may include a gate dielectric layer and a gate electrode layer over the gate dielectric layer. In some embodiments, the gate dielectric layer includes an interfacial layer of dielectric material such as silicon oxide ($SiO_2$), hafnium silicon oxide (HfSiO), or silicon oxynitride (SiON). The interfacial layer may be formed using chemical oxidation, thermal oxidation, ALD, CVD, and/or another suitable method. In some embodiments, the gate dielectric layer includes high-K gate dielectric layer of high-K dielectric materials such as hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or another suitable material. The high-K gate dielectric layer may be formed by ALD, physical vapor deposition (PVD), CVD, thermal oxidation, and/or another suitable method.

In some embodiments, the gate electrode layer includes a conductive material, such as doped semiconductor, a metal, metal alloy, or metal silicide. In some embodiments, the gate electrode layer includes a single layer or alternatively a multi-layer structure. The gate electrode layer may be formed of polysilicon, germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multi-layers thereof. The gate electrode layer may be formed by ALD, PVD, CVD, e-beam evaporation, or another suitable process.

In some embodiments, the source/drain regions are regions of the substrate 302 suitably doped using an implantation process. In some embodiments, the source/drain regions are epitaxially grown source/drain regions using an epitaxial growth process.

An interconnect structure is formed over the semiconductor substrate 202, in accordance with some embodiments. The interconnect structure includes contacts 208, metal layers 210 and vias 212 in one or more intermetal dielectric (IMD) layers 206, as shown in FIG. 2, in accordance with some embodiments. The interconnect structure serves to electrically coupled the underlying peripheral circuits 204 with an overlying memory cell array, in accordance with some embodiments.

The one or more intermetal dielectric layers 206 are made of one or more dielectric materials, such as silicon oxide ($SiO_2$), silicon nitride (SiN), silicon oxynitride (SiON), silicon carbon nitride (SiCN), oxygen-doped silicon carbide (SiC:O), oxygen-doped silicon carbon nitride (SiCN:O), silicon oxycarbide (SiOC), tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material.

The contacts 208 are formed in and/or through the one or more intermetal dielectric layers 206 and land on the gate structure of the peripheral circuits 204, in accordance with some embodiments. In some alternative embodiments, the contacts 208 land on the source/drain regions. In some embodiments, the contacts 208 are made of one or more conductive materials, for example, cobalt (Co), nickel (Ni), tungsten (W), titanium (Ti), tantalum (Ta), cupper (Cu), aluminum (Al), ruthenium (Ru), molybdenum (Mo), TiN, TaN, and/or a combination thereof.

The metal layers 210 and the vias 212 are formed in and/or through the one or more intermetal dielectric layers 206, in accordance with some embodiments. The metal layers 210 provide a horizontal routing for a signal or signals produced by the peripheral circuits 204, in accordance with some embodiments. The vias 212 provide a vertical routing for a signal or signals produced by the peripheral circuit 204, in accordance with some embodiments. In some embodiments, the metal layers 210 and the vias 212 are made of copper (Cu), cobalt (Co), ruthenium (Ru), molybdenum (Mo), tungsten (W), titanium (Ti), another suitable conductive material, an alloy thereof, nitrides of these materials, multi-layers thereof, and/or a combination thereof.

Afterward, the steps as described above with respect to FIGS. 1A through 1N-1 are performed to form a memory cell array over the interconnect structure, as shown in FIG. 2, in accordance with some embodiments. In some embodiments, the second conductive lines 144 of the memory cell array are electrically connected to the peripheral circuits 204 through the interconnect structure. Although not illustrated in FIG. 2, the first conductive lines 122 may also be electrically connected to the peripheral circuits 204 through the interconnect structure. The semiconductor memory structure 200 is referred to as a peripheral circuit under memory array (PUA) device, in accordance with some embodiments.

FIGS. 3A-3B are cross-sectional views illustrating the formation of a semiconductor memory structure 300 at various intermediate stages, in which FIGS. 3A and 3B are modifications of FIGS. 1H-2 and 1N-2, in accordance with some embodiments of the disclosure. FIGS. 3A and 3B correspond to line I-I shown in FIGS. 1H-1 and 1N-1, in accordance with some embodiments. The embodiments of the FIGS. 3A-3B are similar to the embodiments of the FIGS. 1A through 1N-3, except that the etching depths D51-D54 of the notches 119 vary as the level of the first conductive lines 122.

After the deposition of the barrier layer 124 and the metal bulk layer 126, an etching back process is performed to remove portion of the barrier layer 124 and the metal bulk layer 126 outside the gaps 120, thereby forming the first conductive lines 122. In some embodiments, due to the characteristics of the etching process, portions of the first conductive lines 122 exposed from the second through holes 118 may be laterally recessed, e.g., by maximum depths D51-D54, as shown in FIG. 3A. In some embodiments, the depths D51-D54 decrease as the position of the first conductive lines 122 descends (or the level of the first conductive lines 122 decreases).

The steps described above with respect to FIGS. 1I through 1N-3 are performed, thereby forming the second dielectric pillars 128, the ferroelectric layers 132, the channel layers 134, the insulating layers 136, the capping layers 138, the fill layers 140 and the second conductive lines 144, as shown in FIG. 3B, in accordance with some embodiments. The second dielectric pillars 128 includes protruding portions filled in the notches 119, in accordance with some embodiments. In some embodiments, the dimensions of the protruding portions (in the X direction) decrease as the position of the first conductive lines 122 descends (or the level of the first conductive lines 122 decreases).

FIGS. 4A-4B are cross-sectional views illustrating the formation of a semiconductor memory structure 400 at various intermediate stages, in which FIGS. 4A and 4B are modifications of FIGS. 1H-2 and 1N-2, in accordance with some embodiments of the disclosure. FIGS. 4A and 4B correspond to line I-I shown in FIGS. 1H-1 and 1N-1, in accordance with some embodiments. The embodiments of the FIGS. 4A-4B are similar to the embodiments of the FIGS. 1A through 1N-3, except that the sidewalls of the first conductive lines 122 have no concave portion.

After the deposition of the barrier layer 124 and the metal bulk layer 126, an etching back process is performed to remove portions of the barrier layer 124 and the metal bulk layer 126 outside the gaps 120, thereby forming the first conductive lines 122. In some embodiments, due to the characteristics of the etching process, the sidewalls of the first conductive lines 122 facing the second through holes 118 are also substantially flat.

The steps described above with respect to FIGS. 1I through 1N-3 are performed, thereby forming the second dielectric pillars 128, the ferroelectric layers 132, the channel layers 134, the insulating layers 136, the capping layers 138, the fill layers 140 and the second conductive lines 144, as shown in FIG. 4B, in accordance with some embodiments.

As described above, the method for forming a semiconductor memory structure includes forming a stack including first dielectric layers 104 and second dielectric layers 106 alternately arranged, forming first dielectric pillars 110 through the stack, and etching the stack to form a plurality of first trenches 112 and strips 114 between the first trenches 112. The first dielectric pillars 110 may support the strips 114, thereby decreasing the risk of collapsing and/or wiggling of the strips 114, in accordance with some embodiments. Therefore, the manufacturing yield of the resulting semiconductor memory device may improve.

In addition, the method also includes forming sacrificial layers 116 in the first trenches 112, replacing the second dielectric layers 106 with first conductive lines 122, and forming channel layers 134 along strips 114' including the first conductive lines 122 and the first dielectric layers 104. As a result, the first conductive lines 122 may be formed with substantially flat sidewalls, and the channel layers 134 formed thereon also have substantially flat profiles. Therefore, the performance of the resulting semiconductor memory device may improve.

Embodiments of a semiconductor memory structure may be provided. The semiconductor memory structure may include a strip including dielectric layers and first conductive lines alternatively stacked, a second conductive line vertically extending along a first side of the strip, and a dielectric pillar vertically extending along a second side of the strip. The dielectric pillars may support the strips, thereby decreasing the risk of collapsing and/or wiggling of the strips. Therefore, the manufacturing yield of the resulting semiconductor memory device may improve.

In some embodiments, a method for forming a semiconductor memory structure is provided. The method includes forming a stack over a substrate, and the stack includes first dielectric layers and second dielectric layers vertically alternately arranged. The method also includes forming first dielectric pillars through the stack, and etching the stack to form first trenches. Sidewalls of the first dielectric pillars are exposed from the first trenches. The method also includes removing the first dielectric pillars to form through holes, removing the second dielectric layers of the stack to form gaps between the first dielectric layers, and forming first conductive lines in the gaps.

In some embodiments, a semiconductor memory structure is provided. The semiconductor memory structure includes a strip, and the strip includes dielectric layers and first conductive lines alternatively stacked over a substrate. The semiconductor memory structure also includes a second conductive line vertically extending along a first side of the strip, a channel layer sandwiched between the strip and the second conductive line, and a dielectric pillar vertically extending along a second side of the strip that is opposite the first side of the strip.

In some embodiments, a semiconductor memory structure is provided. The semiconductor memory structure includes a first word line and a second word line laterally spaced apart from the first word line, a first channel layer and a second channel layer between the first word line and the second word line, and a dielectric pillar between the first word line and the second word line and between the first channel layer and the second channel layer. The dielectric pillar includes a first protruding portion extending into the first word line and a second protruding portion extending into the second word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor memory structure, comprising:
    forming a stack over a substrate, the stack comprising first dielectric layers and second dielectric layers vertically alternately arranged;
    forming first dielectric pillars through the stack;
    etching the stack to form first trenches, wherein sidewalls of the first dielectric pillars are exposed from the first trenches;
    removing the first dielectric pillars to form through holes;
    removing the second dielectric layers of the stack to form gaps between the first dielectric layers; and
    forming first conductive lines in the gaps.

2. The method for forming the semiconductor memory structure as claimed in claim 1, further comprising:
    forming sacrificial layers in the first trenches before removing the first dielectric pillars; and
    removing the sacrificial layers after forming the first conductive lines in the gaps to form second trenches.

3. The method for forming the semiconductor memory structure as claimed in claim 2, further comprising:
    forming a ferroelectric layer in the second trenches;
    forming a channel layer over the ferroelectric layer in the second trenches; and
    forming an insulating layer over the channel layer in the second trenches.

4. The method for forming the semiconductor memory structure as claimed in claim 3, further comprising:
    forming second conductive lines vertically penetrating through the insulating layer.

5. The method for forming the semiconductor memory structure as claimed in claim 1, wherein removing the second dielectric layers of the stack comprises introducing an etchant into the through holes to laterally etch the second dielectric layers of the stack.

6. The method for forming the semiconductor memory structure as claimed in claim 1, further comprising:
    filling the through holes with second dielectric pillars.

7. The method for forming the semiconductor memory structure as claimed in claim 1, wherein forming the first conductive lines in the gaps comprises:
    forming a barrier layer to partially fill the gaps;
    forming a metal bulk layer to overfill remaining portions of the gaps; and
    etching back the barrier layer and the metal bulk layer.

8. The method for forming the semiconductor memory structure as claimed in claim 1, wherein a sidewall of one of the first conductive lines has a portion that is exposed from one of the through holes, and the portion of the sidewall is concave.

9. The method for forming the semiconductor memory structure as claimed in claim 1, wherein the stack is etched to form strips between the first trenches, and the first dielectric pillars are in contact with sidewalls of the strips.

10. A method for forming a semiconductor structure, comprising:
    forming a stack comprising a plurality of first dielectric material layers interleaved with a plurality of second dielectric material layers;
    etching the stack to form a plurality of strips separated by trenches, the plurality of strips respectively comprising first dielectric material layer segments interleaved with second dielectric material layer segments;
    replacing the second dielectric material layer segments with first conductive lines;
    forming second dielectric pillars within the trenches after forming the first conductive lines, the second dielectric pillars being separated by second trenches;
    forming a ferroelectric layer, a channel layer, and an insulating layer within the second trenches; and
    forming one or more second conductive lines within the insulating layer.

11. The method of claim 10, further comprising:
    forming a sacrificial material within the trenches;
    removing the second dielectric material layer segments, after forming the sacrificial material within the trenches, to form gaps between neighboring ones of the first dielectric material layer segments; and
    forming the first conductive lines within the gaps.

12. The method of claim 11, further comprising:
    removing the sacrificial material, after forming the second dielectric pillars.

13. The method of claim 11, wherein one or more second through holes vertically extend through the sacrificial material and expose sidewalls of the second dielectric material layer segments within the plurality of strips.

14. The method of claim 13, further comprising:
    forming first dielectric pillars within the trenches;
    forming the sacrificial material within the trenches and along sidewalls of the first dielectric pillars; and
    removing the first dielectric pillars to form the one or more second through holes.

15. The method of claim 14, further comprising:
    forming the second dielectric pillars within the one or more second through holes after removing the second dielectric material layer segments.

16. The method of claim 10, wherein the first conductive lines have sidewalls having concave portions and the second dielectric pillars respective include protruding portions that mate with the concave portions of the sidewalls of the first conductive lines.

17. A method for forming a semiconductor structure, comprising:
    forming a stack over a substrate, the stack comprising a plurality of first dielectric layers interleaved with a plurality of second dielectric layers;
    etching the stack to form a plurality of trenches;
    forming a sacrificial material within the plurality of trenches;

forming second through holes that extend through the sacrificial material and expose sides of the plurality of second dielectric layers;

introducing an etchant into the second through holes to remove the plurality of second dielectric layers and form a first plurality of gaps between neighboring ones of the plurality of first dielectric layers;

forming first conductive lines within the first plurality of gaps;

forming second dielectric pillars within the second through holes;

removing the sacrificial material to form a second trenches;

forming a ferroelectric layer, a channel layer, and an insulating layer within the second trenches, the ferroelectric layer arranged along sidewalls of the plurality of first dielectric layers, the first conductive lines, and the second dielectric pillars; and forming one or more second conductive lines along a sidewall of the insulating layer.

18. The method of claim 17, wherein the channel layer is arranged along opposing sides of the one or more second conductive lines.

19. The method of claim 17, wherein the channel layer and the ferroelectric layer continuously extend in a closed loop surrounding the insulating layer and the one or more second conductive lines.

20. The method of claim 17, further comprising:

forming a capping layer on the insulating layer and within the second trenches;

forming a fill layer on the capping layer and within the second trenches;

removing parts of the insulating layer, the capping layer, and the fill layer to form third through holes exposing sidewalls of the channel layer; and forming the one or more second conductive lines within the third through holes.

* * * * *